(12) United States Patent
Kim et al.

(10) Patent No.: US 11,387,253 B2
(45) Date of Patent: Jul. 12, 2022

(54) THREE-DIMENSIONAL SEMICONDUCTOR DEVICES AND METHODS OF FABRICATING THE SAME

(71) Applicant: SAMSUNG ELECTRONICS CO., LTD., Suwon-Si (KR)

(72) Inventors: Sunggil Kim, Yongin-si (KR); Sungjin Kim, Hwaseong-si (KR); Seulye Kim, Seoul (KR); Junghwan Kim, Seoul (KR); Chanhyoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 16/910,199

(22) Filed: Jun. 24, 2020

(65) Prior Publication Data

US 2021/0057445 A1 Feb. 25, 2021

(30) Foreign Application Priority Data

Aug. 21, 2019 (KR) .................. 10-2019-0102564

(51) Int. Cl.
*H01L 27/11582* (2017.01)
*H01L 27/1157* (2017.01)
*H01L 29/10* (2006.01)

(52) U.S. Cl.
CPC ...... *H01L 27/11582* (2013.01); *H01L 29/105* (2013.01); *H01L 29/1037* (2013.01)

(58) Field of Classification Search
CPC ............... H01L 29/1037; H01L 29/105; H01L 29/792–7926; H01L 27/11563;

(Continued)

(56) References Cited

U.S. PATENT DOCUMENTS 9,786,673 B1 10/2017 Cho et al.
9,824,966 B1 * 11/2017 Kanakamedala ..........................
H01L 27/11582

(Continued)

OTHER PUBLICATIONS

German Office Action issued in corresponding German Patent Appln No. DE 102020121073.6 dated May 23, 2022.

*Primary Examiner* — Natalia A Gondarenko
(74) *Attorney, Agent, or Firm* — F. Chau & Associates, LLC

(57) ABSTRACT

A three-dimensional semiconductor device including a conductive layer disposed on a substrate and including a first conductivity-type impurity; an insulating base layer disposed on the conductive layer; a stack structure including a lower insulating film disposed on the insulating base layer, and a plurality of gate electrodes and a plurality of mold insulating layers alternately stacked on the lower insulating film, wherein the insulating base layer includes a high dielectric material; a vertical structure including a vertical channel layer penetrating through the stack structure and a vertical insulating layer disposed between the vertical channel layer and the plurality of gate electrodes, the vertical structure having an extended area extending in a width direction in the insulating base layer; and an isolation structure penetrating through the stack structure, the insulating base layer and the conductive layer, and extending in a direction parallel to an upper surface of the substrate, wherein the conductive layer has an extension portion extending along a surface of the vertical channel layer in the extended area of the vertical structure.

19 Claims, 19 Drawing Sheets

(58) Field of Classification Search
CPC ......... H01L 27/11568; H01L 27/11578; H01L 27/1157; H01L 27/11582; H01L 27/0688; H01L 27/2481; H01L 27/1052; H01L 27/11551; H01L 27/11556; H01L 27/11524; H01L 27/11565; H01L 27/11519; H01L 27/115–11597; H01L 29/04; H01L 29/16; H01L 29/4234–42352; H01L 29/511; H01L 29/518; H01L 29/66825–66833; H01L 29/7883; H01L 29/1033; H01L 21/31055; H01L 21/31116; H01L 21/31138; H01L 21/28282; H01L 21/67069; H01L 21/822; H01L 21/76283; H01L 21/764; H01L 21/8221; H01L 2924/1436; H01L 2924/1438; H01L 2924/1443

USPC ................................ 257/329, 314, 318, 506
See application file for complete search history.

(56) References Cited

U.S. PATENT DOCUMENTS

| | | | |
|---|---|---|---|
| 9,831,260 B2* | 11/2017 | Zhang | H01L 27/11575 |
| 10,163,924 B2 | 12/2018 | Ahn | |
| 10,199,359 B1 | 2/2019 | Sakakibara et al. | |
| 10,720,445 B1* | 7/2020 | Shimizu | H01L 29/4234 |
| 2012/0199897 A1* | 8/2012 | Chang | H01L 21/31111 |
| | | | 257/314 |
| 2016/0071881 A1* | 3/2016 | Lee | H01L 29/7827 |
| | | | 257/314 |
| 2016/0190155 A1 | 6/2016 | Lee et al. | |
| 2017/0365613 A1 | 12/2017 | Gunji-Yoneoka et al. | |
| 2018/0226427 A1 | 8/2018 | Huang et al. | |
| 2018/0342528 A1 | 11/2018 | Lee | |
| 2018/0366486 A1* | 12/2018 | Hada | H01L 27/11556 |
| 2018/0374866 A1 | 12/2018 | Makala et al. | |
| 2019/0067312 A1 | 2/2019 | Arisumi et al. | |
| 2019/0067317 A1 | 2/2019 | Shioda et al. | |
| 2019/0074284 A1 | 3/2019 | Akutsu et al. | |
| 2019/0081071 A1 | 3/2019 | Sun et al. | |
| 2019/0088586 A1 | 3/2019 | Ichinose et al. | |
| 2019/0296046 A1* | 9/2019 | Arai | H01L 27/11575 |

* cited by examiner

THREE-DIMENSIONAL SEMICONDUCTOR DEVICES AND METHODS OF FABRICATING THE SAME

CROSS-REFERENCE TO RELATED APPLICATION(S)

This application claims priority under 35 U.S.C. § 119(a) to Korean Patent Application No. 10-2019-0102564 filed on Aug. 21, 2019 in the Korean Intellectual Property Office, the disclosure of which is incorporated by reference herein in its entirety.

TECHNICAL FIELD

The present inventive concept relates to a three-dimensional semiconductor device and a method of fabricating the same.

DISCUSSION OF RELATED ART

Electronic products are becoming smaller and require higher data throughput. In other words, as electronic products are decreasing in size their data throughput requirements are also increasing. Accordingly, semiconductor devices used in such electronic products require high integration. To increase the degree of integration of a semiconductor device, a three-dimensional semiconductor device having a three-dimensional (for example, vertical) transistor structure instead of a planar transistor structure may be used.

SUMMARY

According to an exemplary embodiment of the inventive concept, there is provided three-dimensional semiconductor device including a conductive layer disposed on a substrate and including a first conductivity-type impurity; an insulating base layer disposed on the conductive layer; a stack structure including a lower insulating film disposed on the insulating base layer, and a plurality of gate electrodes and a plurality of mold insulating layers alternately stacked on the lower insulating film, wherein the insulating base layer includes a high dielectric material; a vertical structure including a vertical channel layer penetrating through the stack structure and a vertical insulating layer disposed between the vertical channel layer and the plurality of gate electrodes, the vertical structure having an extended area extending in a width direction in the insulating base layer; and an isolation structure penetrating through the stack structure, the insulating base layer and the conductive layer, and extending in a direction parallel to an upper surface of the substrate, wherein the conductive layer has an extension portion extending along a surface of the vertical channel layer in the extended area of the vertical structure.

According to an exemplary embodiment of the inventive concept, there is provided three-dimensional semiconductor device including a conductive layer disposed on a substrate; an insulating base layer disposed on the conductive layer and having a plurality of support regions in contact with the substrate; a stack structure having a plurality of gate electrodes and a plurality of mold insulating layers alternately disposed on the insulating base layer; a vertical structure including a vertical channel layer penetrating through the stack structure, and a vertical insulating layer disposed between the vertical channel layer and the plurality of gate electrodes, the vertical structure having a first extended area extending in a width direction in the insulating base layer and having a convex side; and an isolation structure penetrating through the stack structure, the insulating base layer and the conductive layer, extending in a first direction parallel to an upper surface of the substrate, and having a second extended area extending in a second direction intersecting the first direction and parallel to the upper surface of the substrate in the insulating base layer, wherein the conductive layer has an extension portion extending along a surface of the vertical channel layer, and an upper end of the extension portion is connected to a lower end of the vertical insulating layer on the surface of the vertical channel layer in the first extended area of the vertical structure.

According to an exemplary embodiment of the inventive concept, there is provided three-dimensional semiconductor device including a conductive layer disposed on a substrate and including a first conductive impurity; an insulating base layer disposed on the conductive layer and having a plurality of support regions in contact with the substrate; a stack structure having a plurality of gate electrodes and a plurality of mold insulating layers alternately disposed on the insulating base layer, the insulating base layer including a high dielectric material; a vertical structure including a vertical channel layer penetrating through the stack structure and a vertical insulating layer disposed between the vertical channel layer and the plurality of gate electrodes, the vertical structure having a first area with a convex side in the insulating base layer; and an isolation structure penetrating through the stack structure, the insulating base layer and the conductive layer, extending in a direction parallel to an upper surface of the substrate, and having a second area with a convex side in the insulating base layer, wherein the conductive layer has an extension portion extending along a surface of the vertical channel layer, and the extension portion is connected to the vertical insulating layer on the surface of the vertical channel layer in the first area of the vertical structure.

According to an exemplary embodiment of the present inventive concept, a method of fabricating a three-dimensional semiconductor device includes forming a lower sacrificial layer on a substrate; forming an etch-stop layer on the substrate to cover the lower sacrificial layer; forming a stack structure by alternately stacking a plurality of sacrificial layers and a plurality of mold insulating layers on the etch-stop layer, the etch-stop layer including a high dielectric material having etch selectivity with the plurality of sacrificial layers and the plurality of mold insulating layers; forming a channel hole penetrating through the stack structure to connect to the etch-stop layer; extending a portion of the channel hole positioned in the etch-stop layer to expose the lower sacrificial layer; forming a vertical structure by sequentially forming a vertical insulating layer and a vertical channel layer on an inner sidewall and a bottom surface of the channel hole; forming an opening penetrating through the stack structure and the etch-stop layer to connect to the lower sacrificial layer, removing a portion of the vertical insulating layer positioned in the etch-stop layer, along with the lower sacrificial layer, through the opening; and forming a conductive layer by filling in a space formed by removing the portion of the vertical insulating layer, with a conductive material including a first conductivity-type impurity, wherein the forming of the conductive layer includes forming a conductive film connected to the conductive layer.

According to an exemplary embodiment of the present inventive concept, a three-dimensional semiconductor device includes: a conductive layer disposed on a substrate and including a first conductivity-type impurity; an insulating layer disposed on the conductive layer; a stack structure including a lower insulating film disposed on the insulating layer, and a plurality of gate electrodes and a plurality of mold insulating layers alternately stacked on the lower insulating film, wherein the insulating layer includes a high dielectric material; a vertical structure including a vertical channel layer penetrating through the stack structure and a vertical insulating layer disposed between the vertical channel layer and the plurality of gate electrodes, the vertical structure having a first area in the insulating layer, wherein a side of the first area in the insulating layer overlaps a lowermost gate electrode of the gate electrodes in a direction perpendicular to an upper surface of the substrate; and a conductive film extending from the conductive layer and covering at least a portion of the vertical channel layer in the first area, wherein the conductive film includes the first conductivity-type impurity.

BRIEF DESCRIPTION OF THE DRAWINGS

The above and other features of the present inventive concept will be more clearly understood by describing in detail exemplary embodiments thereof in conjunction with the accompanying drawings, in which.

DETAILED DESCRIPTION OF THE EMBODIMENTS

Figure 1:
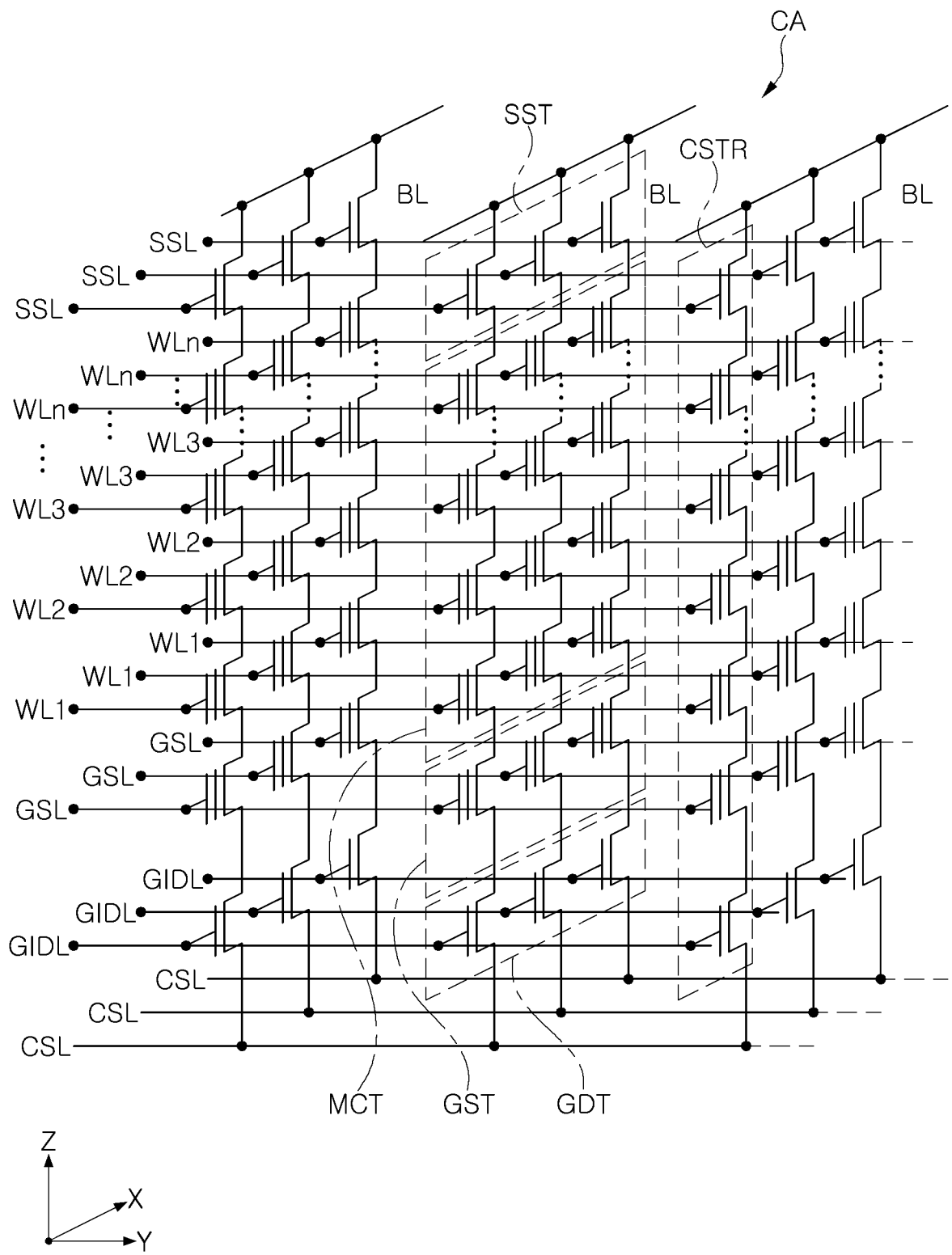
FIG. 1 is an equivalent circuit diagram of a memory cell array of a three-dimensional (3D) semiconductor device according to an exemplary embodiment of the present inventive concept.

Hereinafter, exemplary embodiments of the present inventive concept will be described with reference to the accompanying drawings. Like reference numerals may refer to like elements in the drawings.

Figure 2:
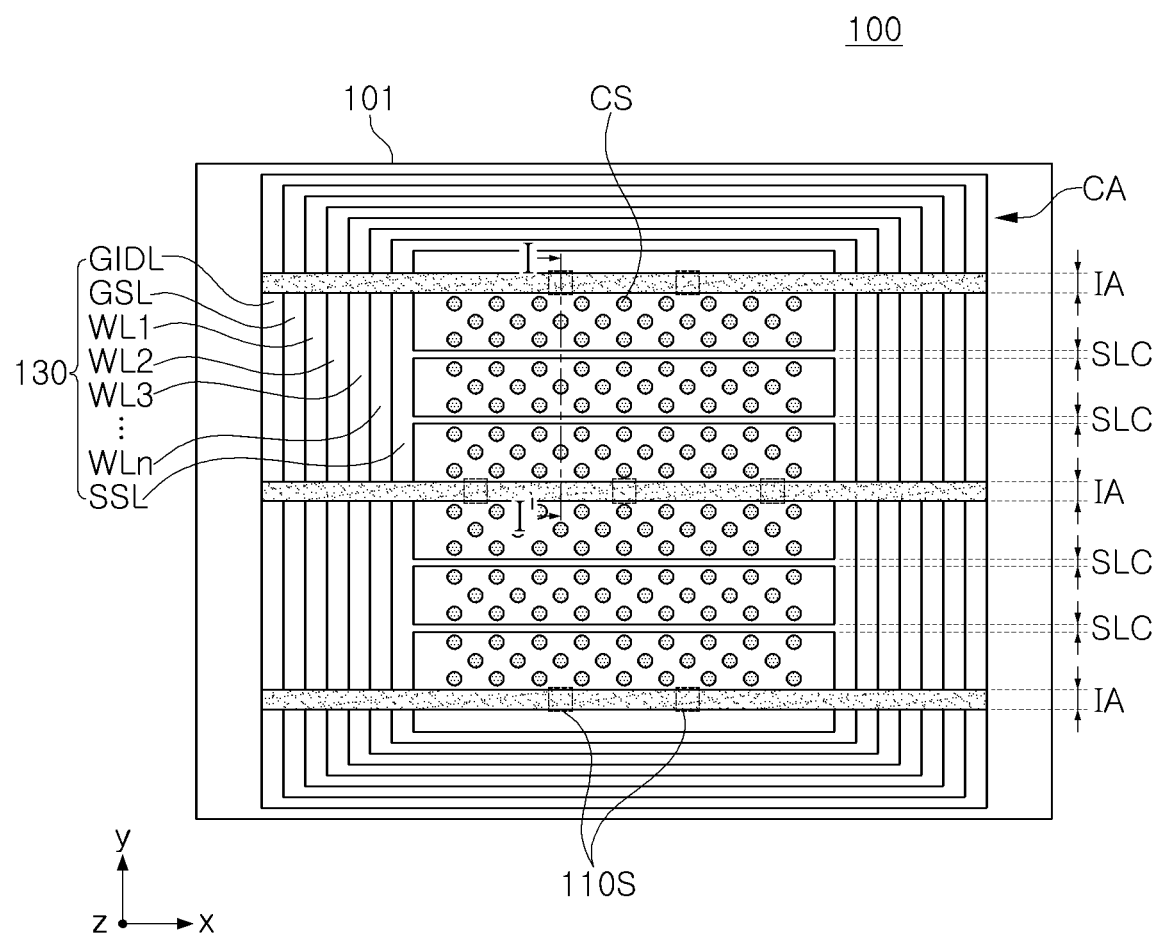
FIG. 2 is a schematic plan view illustrating a three-dimensional semiconductor device according to an exemplary embodiment of the present inventive concept.

FIG. 1 is an equivalent circuit diagram of a memory cell array of a three-dimensional (3D) semiconductor device according to an exemplary embodiment of the present inventive concept, and FIG. 2 is a schematic plan view illustrating a memory cell array CA of a 3D semiconductor device 100 according to an exemplary embodiment of the present inventive concept. In this case, an equivalent circuit of FIG. 1 may be implemented like the memory cell array CA of FIG. 2.

Referring to FIG. 1, the memory cell array CA may include a common source line CSL, a plurality of bit lines BL, a plurality of cell strings CSTR disposed between the common source line CSL and the bit lines BL, and a plurality of ground select lines GSL.

The common source line CSL may be a conductive thin film disposed on a substrate 101 or an impurity region (for example, a conductive layer 180 of FIG. 3) formed in the substrate 101. The bit lines BL may be two-dimensionally arranged, and a plurality of cell strings CSTR may be connected to each of the bit lines BL in parallel. The cell strings CSTR may be commonly connected to the common source line CSL. The plurality of the cell strings CSTR may be disposed between a plurality of the bit lines BL and the common source line CSL. In exemplary embodiments of the present inventive concept, the common source line CSL may be provided as a plurality of common source lines, and the plurality of common source lines may be arranged in two dimensions. In this case, the same voltage may be applied to the common source lines CSL, or the common source lines CSL may be respectively electrically controlled.

The memory cell array in this embodiment includes GIDL transistors (GDT) for performing an erasing operation of the memory cell array CA using a gate induced drain leakage (GIDL) method. The GIDL transistors GDT may be disposed at a lowermost position of the memory cell array CA. For example, the GIDL transistors GDT may be disposed between the ground select line GSL and the common source line CSL, and may be referred to as "bottom GIDL transistors". In exemplary embodiments of the present inventive concept, the bottom GIDL transistors may be provided in plural (for example, two). In exemplary embodiments of the present inventive concept, at least one or more "top GIDL transistors" may be further provided between string select lines SSL and the bit lines BL. A gate of the GIDL transistors GDT may be connected to a line indicated by GIDL in FIG. 1.

Each of the cell strings CSTR includes the GIDL transistor GDT and a ground select transistor GST connected to the common source line CSL, a string select transistor SST connected to the bit lines BL, and a plurality of memory cell transistors MCT disposed between the ground and string select transistors GST and SST. The ground select transistor GST, the string select transistor SST and the memory cell transistors MCT may be connected in series. The common source line CSL may be connected to sources of the ground select transistors GST in common.

The ground select line GSL, a plurality of word lines WL1 to WLn, and a plurality of the string select lines SSL, disposed between the common source line CSL and the bit lines BL, may be used as gate electrodes of the ground select transistor GST, the memory cell transistors MCT and the string select transistors SST, respectively. Each of the memory cell transistors MCT may include a data storage element.

As illustrated in FIG. 2, the ground select line GSL, the word lines WL1 to WLn, and the string select line SSL may be sequentially formed above the substrate 101, and mold insulating layers 122 (see FIG. 3) may be disposed below and/or on each of gate electrodes 130. The gate electrodes 130 may decrease in area as a distance thereof from the substrate 101 increases. In other words, an uppermost one of the gate electrodes 130 may have an area smaller than a lowermost one of the gate electrodes 130. The bit lines (BL in FIG. 3) may be conductive patterns, for example, metal lines spaced apart from the substrate 101 and disposed above the substrate 101.

In FIG. 2, the memory cell array CA may be divided by an isolation structure IA. The string select line SSL of the gate electrodes 130 may be divided by a selection line cut region SLC. In exemplary embodiments of the present inventive concept, the isolation structure IA may be provided in a structure in which one or more insulating materials are gap-filled. For example, the insulating material may include silicon oxide, silicon nitride, or silicon oxynitride.

The memory cell array CA may include a plurality of vertical structures CS penetrating through the gate electrodes 130 and the mold insulating layers 122 (see FIG. 3) in a third direction Z. The plurality of vertical structures CS may be spaced apart from each other by a predetermined interval between the isolation structures IA. Support regions 110S may be arranged in the isolation structure 1A at regular intervals. The support region 110S is an area of an insulating base layer 110 (see FIG. 3) in contact with the substrate 101 to support a space for the formation of the conductive layer (180 in FIG. 3), which will be described in more detail with reference to FIG. 3.

Figure 3:
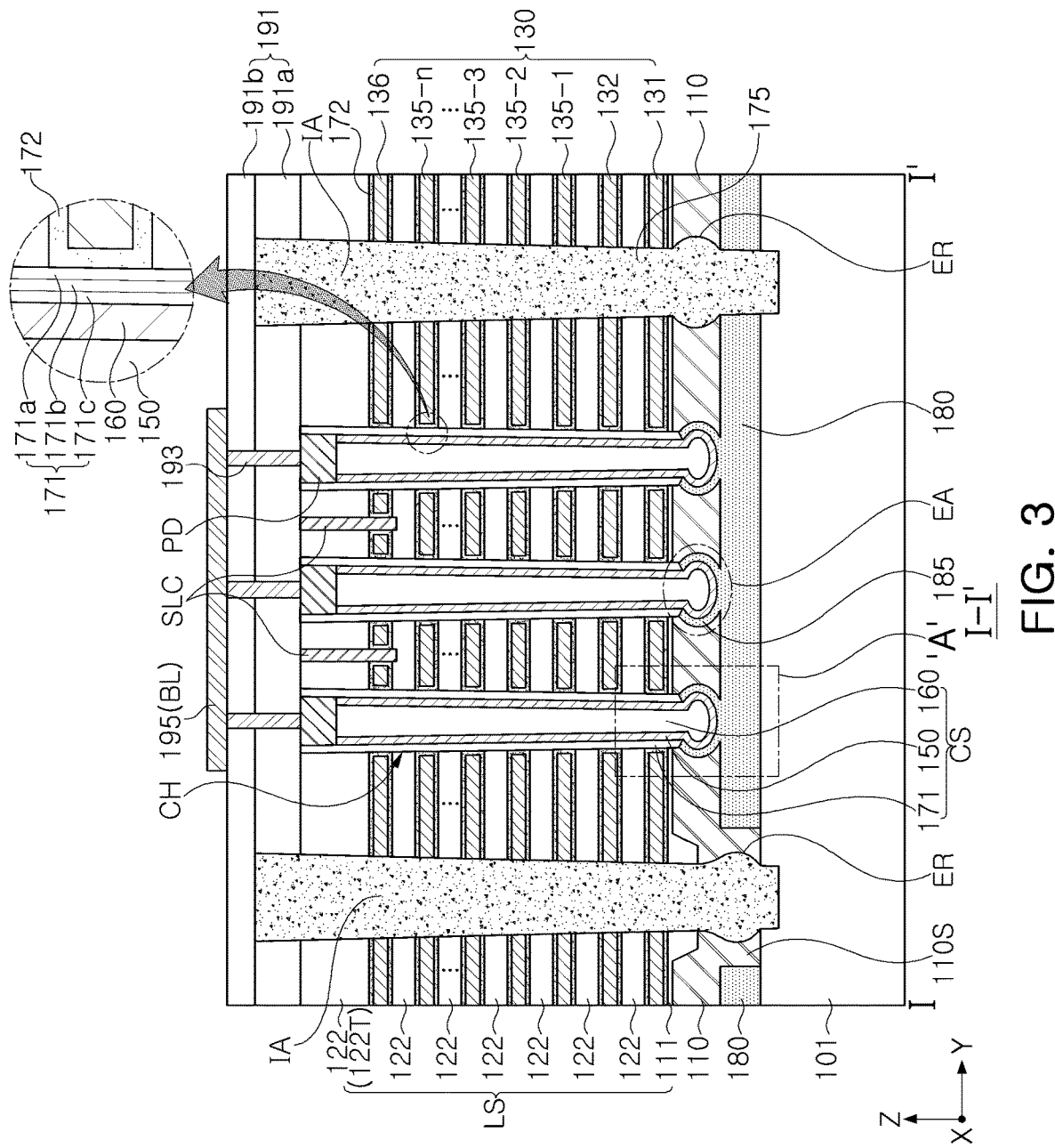
FIG. 3 is a cross-sectional view of the 3D semiconductor device illustrated in FIG. 2, taken along line I-I'.

FIG. 3 is a cross-sectional view of the 3D semiconductor device taken along line I-I' in FIG. 2.

Referring to FIG. 3, the semiconductor device 100 includes the substrate 101, and a stack structure LS having mold insulating layers 122 and a plurality of gate electrodes 130 alternately stacked on the substrate 101.

For example, the substrate 101 may be a silicon substrate, a germanium substrate, or a silicon-germanium substrate. In this exemplary embodiment, the plurality of gate electrodes 130 may include a lowermost gate electrode 131, a next lower gate electrode 132, an uppermost gate electrode 136, and cell gate electrodes 135-1, 135-2, 135-3, . . . and 135-$n$ stacked between the lowermost gate electrode 131 and the uppermost gate electrode 136. The lowermost gate electrode 131 is an element related with the GIDL transistor GDT, and the next lower gate electrode 132 and the uppermost gate electrode 136 may be elements related with the ground select transistors GST and the string select transistor SST, respectively. The cell gate electrodes 135-1, 135-2, 135-3, . . . and 135-$n$ may be elements related with the plurality of memory cell transistors MCT (see FIGS. 1 and 2). The number of cell gate electrodes 135-1, 135-2, 135-3 . . . and 135-$n$ may be determined depending on a required capacitance of the semiconductor device 100, and for example, may be 30 or more.

The lowermost gate electrodes 131 may include a plurality of other gate electrodes, and for example, may include two gate electrodes.

The stack structure LS may have a shape extending in a first direction X and a second direction Y intersecting the first direction X in a plan view. The plurality of gate electrodes 130 may be sequentially stacked in a third direction Z intersecting both the first and second directions X and Y. The first direction X and the second direction Y may be substantially parallel to an upper surface of the substrate 101, and the third direction Z may be substantially perpendicular to the upper surface of the substrate 101. The plurality of gate electrodes 130 may be separated from each other by the mold insulating layers 122.

For example, the mold insulating layers 122 may include a silicon film, a silicon oxide film, a silicon carbide film, a silicon oxynitride film, or a silicon nitride film. For example, the plurality of gate electrodes 130 may include a metal and/or a conductive metal nitride such as polysilicon (poly-Si) or tungsten (W).

The stack structure LS may further include a lower insulating film 111 disposed on a lower surface facing the substrate 101. The lower insulating film 111 may include, for example, a silicon oxide film, a silicon nitride film, a high dielectric film (for example, an aluminum oxide film, a hafnium oxide film and the like), or combinations thereof. The lower insulating film 111 may have a thickness less than a thickness of the mold insulating layers 122. In other words, the lower insulating film 11 may be thinner than the mold insulating layers 122.

The stack structure LS includes channel holes CH formed in the third direction Z perpendicular to the upper surface of the substrate 101. The vertical structure CS is provided in the channel holes CH. The vertical structure CS may include a vertical channel layer 150 penetrating through the stack structure LS, and a vertical insulating layer 171 disposed between the vertical channel layer 150 and the plurality of gate electrodes 130. The vertical structure CS may further include an insulating core 160 disposed in the third direction (for example, Z direction) in the vertical channel layer 150. The vertical insulating layer 171 may have a pipe shape or a macaroni shape with open top and bottom ends.

The vertical structure CS may be electrically connected to the conductive layer 180 while penetrating through the stack structure LS. The vertical structure CS may be provided in plural in the stack structure LS, and the plurality of vertical structures CS may be arranged in the first and second directions (for example, X and Y directions) in a plan view. The plurality of vertical structures CS may be arranged in a zigzag form, as illustrated in FIG. 2. For example, in FIG. 2, the vertical structures CS extending the X direction may be arranged in a zigzag fashion.

The vertical insulating layer 171 may include a memory element of a flash memory device. For example, the vertical insulating layer 171 may include a charge storage film 171$b$ of the flash memory device. Data stored in the vertical insulating layer 171 may be changed using Fowler-Nordheim tunneling caused by a voltage difference between the vertical channel layer 150 and the gate electrodes 130. Alternatively, the vertical insulating layer 171 may also include a thin film, for example, a thin film for a phase change memory or a thin film for a variable resistance memory, capable of storing information based on other operating principles.

The vertical insulating layer 171 may further include a tunnel insulating film 171$c$ between the charge storage film 171$b$ and the vertical channel layers ISO. The tunnel insulating film 171$c$ may directly contact the vertical channel layer 150. In exemplary embodiments of the present inventive concept, the vertical insulating layer 171 may further include a blocking insulating film 171$a$ interposed between the charge storage film 171$b$ and the gate electrodes 130. For example, the charge storage film 171$b$ may include a silicon nitride layer, a silicon oxynitride layer, a silicon-rich nitride layer, or a nanocrystalline silicon or laminated trap layer. The tunnel insulating film 171$c$ may include a material having an energy band gap greater than that of the charge storage film 171$b$. For example, the tunnel insulating film 171$c$ may be a silicon oxide layer. The blocking insulating film 171$a$ may include a material having an energy band gap greater than that of the charge storage film 171$b$. For example, the blocking insulating film 171$a$ may be a silicon oxide layer, a silicon nitride layer, and/or a silicon oxynitride layer.

In this embodiment, the vertical structure CS is illustrated to have substantially the same width in the vertical direction (Z direction), but the vertical structure CS (or the channel holes CH) may have a shape in which a width thereof becomes narrow toward the substrate 101.

Referring to FIG. 3, planar insulating layers 172 may be provided on upper and lower surfaces of the gate electrodes 130, respectively. Each of the planar insulating layers 172 may extend between each of the gate electrodes 130 and the vertical insulating layer 171. The planar insulating layers 172 may be comprised of one thin film or a plurality of thin films. In exemplary embodiments of the present inventive concept, the planar insulating layers 172 may include a blocking insulating film of a charge trapping flash memory transistor.

A wiring (bit lines 195) may be disposed on the stack structure LS to transverse an upper surface of the stack structure LS. The bit lines 195 may be connected to a pad PD positioned on the top of the vertical structure CS through a contact via 193. An interlayer insulating layer 191 may be interposed between the bit lines 195 and the stack structure LS, and the contact via 193 may penetrate through the interlayer insulating layer 191. The interlayer insulating layer 191 may include a first insulating film 191a disposed on the stack structure LS to cover the pad PD of the vertical structure CS, and a second insulating film 191b disposed on the first insulating film 191a to cover the isolation structure IA.

The semiconductor device 100 according to this embodiment includes the conductive layer 180 constituting a common source line disposed between the substrate 101 and the stack structure LS. The insulating base layer 110 may be disposed on the conductive layer 180 to cover the conductive layer 180. The insulating base layer 110 (in this case, the insulating base layer 110 may also be referred to as an etch-stop layer) may have a support region 110S in contact with a portion of the substrate 101. The support region 110S is a means for supporting a space generated by removing a lower sacrificial layer before forming the conductive layer 180 (see FIG. 11). The support regions 110S may be arranged at a regular interval in the region in which the isolation structure IA is to be formed, as illustrated in FIG. 2.

The conductive layer 180 may include a conductive material doped with a first conductivity-type impurity. For example, the conductive layer 180 may include polysilicon (poly-Si) doped with n-type impurities. The insulating base layer 110 may serve as an etch-stop layer, and may include a high dielectric material having etch selectivity with materials (for example, the mold insulating layers 122) of the stack structure LS. The insulating base layer 110 employed in this embodiment may include a high dielectric material. For example, the insulating base layer 110 may include aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). For example, the insulating base layer 110 may include $Al_2O_3$ or $HfO_2$.

Since the insulating base layer 110 employed in this embodiment is formed of a high dielectric film having a relatively high etching selectivity, the position of a preliminary hole (for example, the inside of the insulating base layer 110) in a channel hole (CH) formation process may be relatively accurate. Unlike a conventional conductive etch-stop layer (for example, a polysilicon layer), the insulating base layer 110 having electrical insulation may relieve electrical stress of a transistor adjacent thereto, for example, a GIDL transistor.

In this embodiment, the vertical structure CS has an end extending into the insulating base layer 110, and the end of the vertical structure CS has a first extended area EA extending in a width direction in the insulating base layer 110. For example, the first extended area EA may extend in the Y direction. Further, the first extended area EA may have a jar shape with a convex side. The first extended area EA may be obtained in a process of etching to the insulating base layer 110, which is an etch-stop layer, and then performing isotropical etching (for example, wet etching), and expanding in the width direction to expose the lower sacrificial layer 105 (see FIG. 7).

Figure 4:
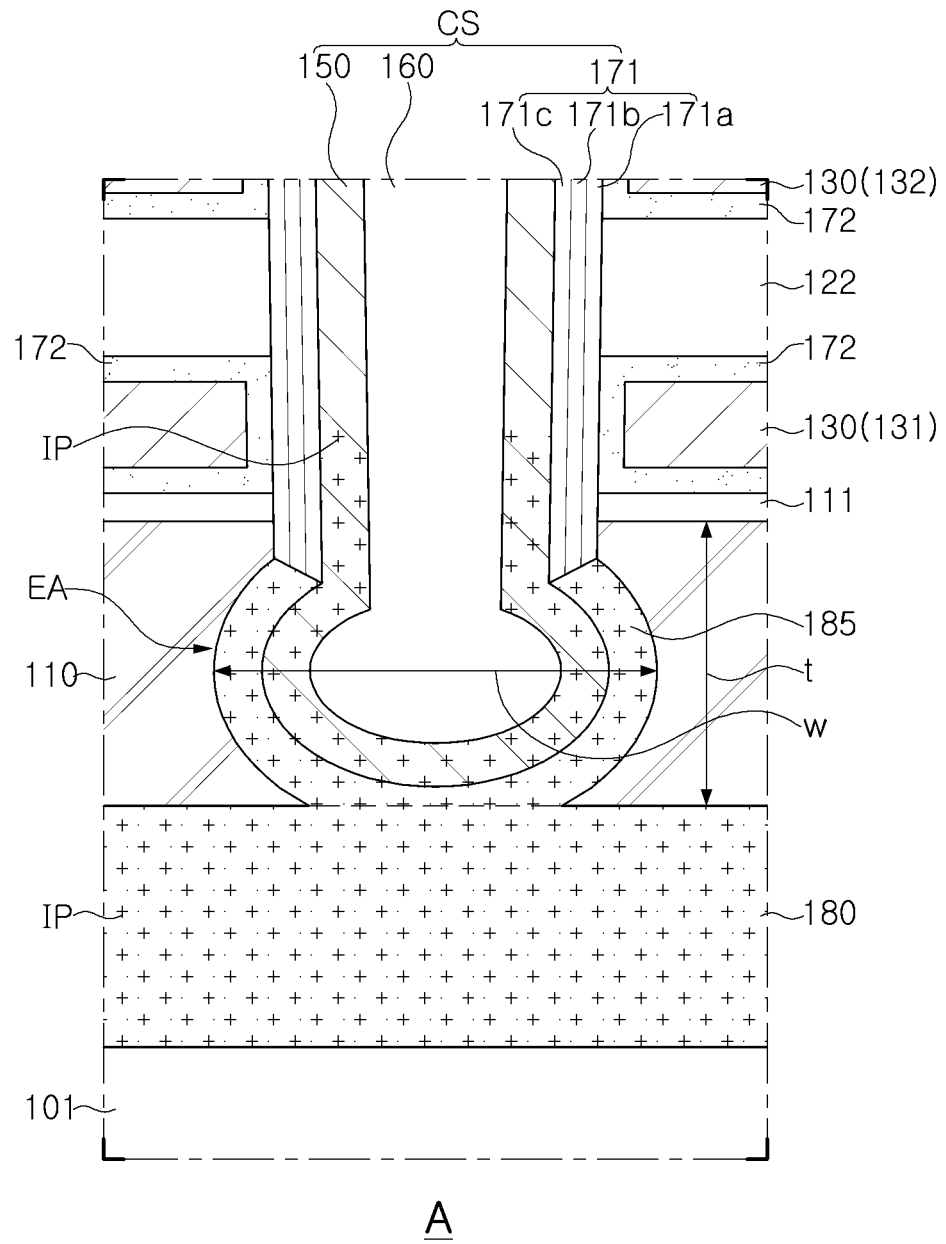
FIG. 4 is an enlarged cross-sectional view of region "A" in the 3D semiconductor device illustrated in FIG. 3.

The first extended area EA of the vertical structure CS may be connected to the conductive layer 180. The vertical structure CS may include a conductive film 185 extending along the surface of the vertical channel layer 150 from a bottom of the vertical structure CS contacting the conductive layer 180 in the first extended area EA. For example, the sides of the first extended area EA may be covered by the conductive film 185. FIG. 4 is a partially enlarged cross-sectional view illustrating an enlarged area "A" of the semiconductor device illustrated in FIG. 3.

Referring to FIG. 4, the first extended area EA may include an end portion of the insulating core 160, which is convex in the width direction, and a portion of the vertical channel layer 150 disposed along the surface of the convex end portion. The conductive film 185 may be disposed on a surface of the portion of the vertical channel layer 150 positioned on the bottom of the first extended area EA to contact the conductive layer 180.

The conductive film 185 may be an element extending from the conductive layer 180 and may include the same conductive material as that of the conductive layer 180. The conductive film 185 is also referred to as an "extension portion of the conductive layer 180." The extension portion is extended along a surface of the vertical channel layer 150 in the first extended area EA of the vertical structure CS. The conductive film 185 may be a conductive material doped with a high concentration of a first conductivity-type impurity IP (for example, an n-type impurity) (denoted by +), in the same manner or similarly to the conductive layer 180. The first conductivity-type impurity IP may be diffused from the conductive film 185 to a portion of the vertical channel layer 150 adjacent to the conductive film 185. For example, the conductive layer 180 and the conductive film 185 may include polysilicon doped with n-type impurities. In exemplary embodiments of the present inventive concept, the vertical channel layer 150 may also include polysilicon, which is the same material as the conductive layer 180 and the conductive film 185. An additional heat treatment process may be performed to effectively induce such impurity diffusion.

In this embodiment, a portion of the vertical channel layer 150 adjacent to the conductive film 185 may have a region (denoted by +) in which the first conductivity-type impurity IP is diffused. The portion of the vertical channel layer 150 adjacent to the conductive film 185 may include a portion adjacent to the lowermost gate electrode 131 in the vertical channel layer 150. For example, the first conductivity-type impurity IP of the conductive film 185 may be diffused to the portion of the vertical channel layer 150 adjacent to the lowermost gate electrode 131. For example, the vertical channel layer ISO adjacent to the lowermost gate electrode 131 has a region (denoted by +) in which the first conductivity-type impurity IP is diffused.

As a result, a portion of a channel region used for the formation of the GIDL transistor may be doped with the first conductivity-type (for example, an n-type) impurity IP, even when it is located at a lower end of the memory cell array CA. For example, the impurity concentration in the channel region of the GIDL transistor may be in the range of 2 to 10 counts/cm$^3$ based on X-ray fluorescence (XRF).

As such, the conductive material doped with impurities (IP) at a high concentration constituting the conductive layer 180 that constitutes the common source line CSL may be extended to the first extended area EA that is in contact with the conductive layer 180, by forming the conductive film 185. By using the conductive film 185, the impurities IP may be effectively diffused to a portion of the vertical channel layer 150 adjacent to the conductive film 185.

As illustrated in FIG. 4, the conductive film 185 may extend to an upper half of the first extended area EA. For example, the conductive film 185 may extend close to an upper portion of the insulating base layer 110. The conductive film 185 serving as an impurity source may be disposed closer to the channel region of the GIDL transistor, for example, a portion of the vertical channel layer 150 adjacent to the lowermost gate electrode 131.

The conductive film 185 may be provided in the process of forming the conductive layer 180. For example, in the process of removing the lower sacrificial layer that is filled in the space for the conductive layer 180, a portion of the vertical insulating layer 171 positioned in the first extended area EA is removed. In this case, the conductive film 185 may also be formed in the space in which the portion of the vertical insulating layer has been removed while filling a conductive material for the conductive layer 180. As a result, as illustrated in FIG. 4, an upper end of the conductive film 185 may be connected to a lower end of the remaining vertical insulating layer 171.

The first extended area EA positioned in the insulating base layer 110 may have a width W that is greater than a width of the vertical structure CS adjacent thereto. The width W of the first extended area EA may be determined by an etched position of the channel hole CH (before the etching process for expansion), a thickness t of the insulating base layer 110 that is an etch-stop layer, or the like. Deviations of the thickness t of the insulating base layer 110 and the maximum width W of the first extended area EA may both be within a range of 30%. For example, the thickness t of the insulating base layer 110 may range from 30 to 50 nm, and the maximum width W of the first extended area EA may range from 30 to 60 nm.

The semiconductor device 100 may include the isolation structure IA penetrating through the stack structure LS, the insulating base layer 110 and the conductive layer 180. The isolation structure IA may be formed to penetrate a portion of the substrate 101. As illustrated in FIG. 2, the isolation structure IA may extend in a direction parallel to the upper surface of the substrate 101. The isolation structure IA may have a second extended area ER extending in the width direction in the insulating base layer 110.

The second extended area ER may be obtained in the process of expanding in the width direction (e.g., the Y direction in FIG. 3) while exposing the substrate 101 by applying isotropic etching after etching up to the insulating base layer 110, similarly to the first extended area EA. The isolation structure IA may be formed by filling an insulating material 175. Since the level of the insulating base layer 110 in the support region 110S is slightly lower than the level of the insulating base layer 110 in other regions, the levels of the second extended areas ER of the isolation structure IA located on the support region 110S and the isolation structure IA in regions other than the support region 110S may be slightly different from each other. In addition, since the etch stop positions may be different in the process of forming the preliminary hole (see FIG. 9), the shapes of the second extended areas ER may be different from each other. For example, the second extended area ER in the support region 110S may be closer to the substrate 101 than the second extended are ER in a region other than the support region IOS.

In this embodiment, an upper end of the conductive film 185 is positioned on the upper half of the first extended area EA to be adjacent to the lowermost gate electrode 131, but in another exemplary embodiment of the present inventive concept, when the upper end of the conductive film 185 is located below the lower insulating film 111, the position of the upper end of the conductive film 185 may be variously changed depending on an etching process (see FIG. 12) of removing the lower sacrificial layer during the formation of the conductive layer 180.

Figure 5:
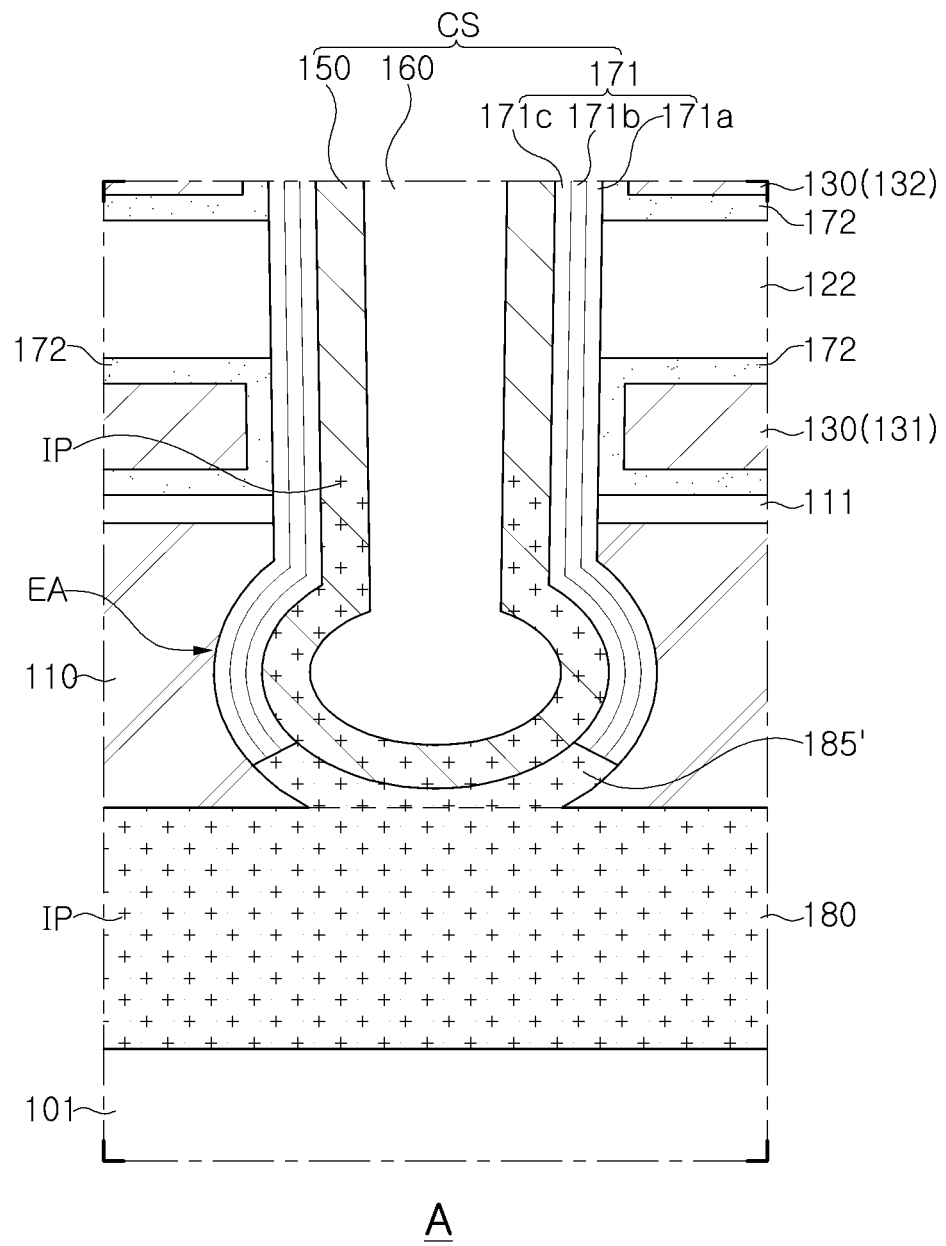
FIG. 5 is a partially enlarged view of region of a three-dimensional semiconductor device according to an exemplary embodiment of the present inventive concept, corresponding to region "A" of FIG. 3.

FIG. 5 is a cross-sectional view illustrating a semiconductor device according to another exemplary embodiment of the present inventive concept and may correspond to an enlarged cross-sectional view of region "A" corresponding to FIG. 4.

Referring to FIG. 5, except that an upper end of a conductive film 185' is positioned in the lower half of a first extended area EA, the semiconductor device according to this embodiment is similar to the semiconductor device 100 illustrated in FIGS. 1 to 3. Accordingly, the components of this embodiment may correspond to those described with reference to the semiconductor device 100 illustrated in FIGS. 1 to 3, unless otherwise stated.

Similar to the previous embodiment, a vertical structure CS employed in this embodiment may be connected to a conductive layer 180 by the conductive film 185' positioned in the first extended area EA. Since the conductive film 185' extends from the conductive layer 180, the conductive layer 180 and the conductive film 185' may be integrated with the same material.

The conductive film 185' of the vertical structure CS may be positioned in a portion of the first extended area EA in contact with the conductive layer 180, for example, in a bottom portion of the first extended area EA. In addition, the conductive film 185' may extend from the bottom portion of the first extended area EA. An upper end of the conductive film 185' may be positioned in a lower half of the first extended area EA. In this case, since the conductive film 185' contacts a portion of the vertical channel layer 150 positioned in the first extended area EA, impurities (IP) may be diffused to a portion of the vertical channel layer 150 adjacent to the lowermost gate electrode 131 through the contacted portion. As such, as long as the upper end of the conductive film 185' is not in contact with gate electrodes 130 through the lower insulating film 111, the upper end position of the conductive film 185' may be variously changed depending on the etching process (see FIG. 12) of removing the lower sacrificial layer during the formation of the conductive layer 180.

The semiconductor device 100 according to the foregoing example embodiments is illustrated based on the memory cell array CA as illustrated in FIG. 3, but may have a structure in which a peripheral circuit structure is stacked to be perpendicular to the upper surface of the substrate 101, for example, in a Z direction, for example, a cell-on-peri or cell-over-peri (COP) structure.

FIGS. 6 to 13 are cross-sectional views corresponding to FIG. 3 and illustrate processes in a method of fabricating a 3D semiconductor device according to exemplary embodiments of the present inventive concept. FIGS. 14A to 14C are partial enlarged views of FIGS. 7, 8 and 12, respectively.

Figure 6:
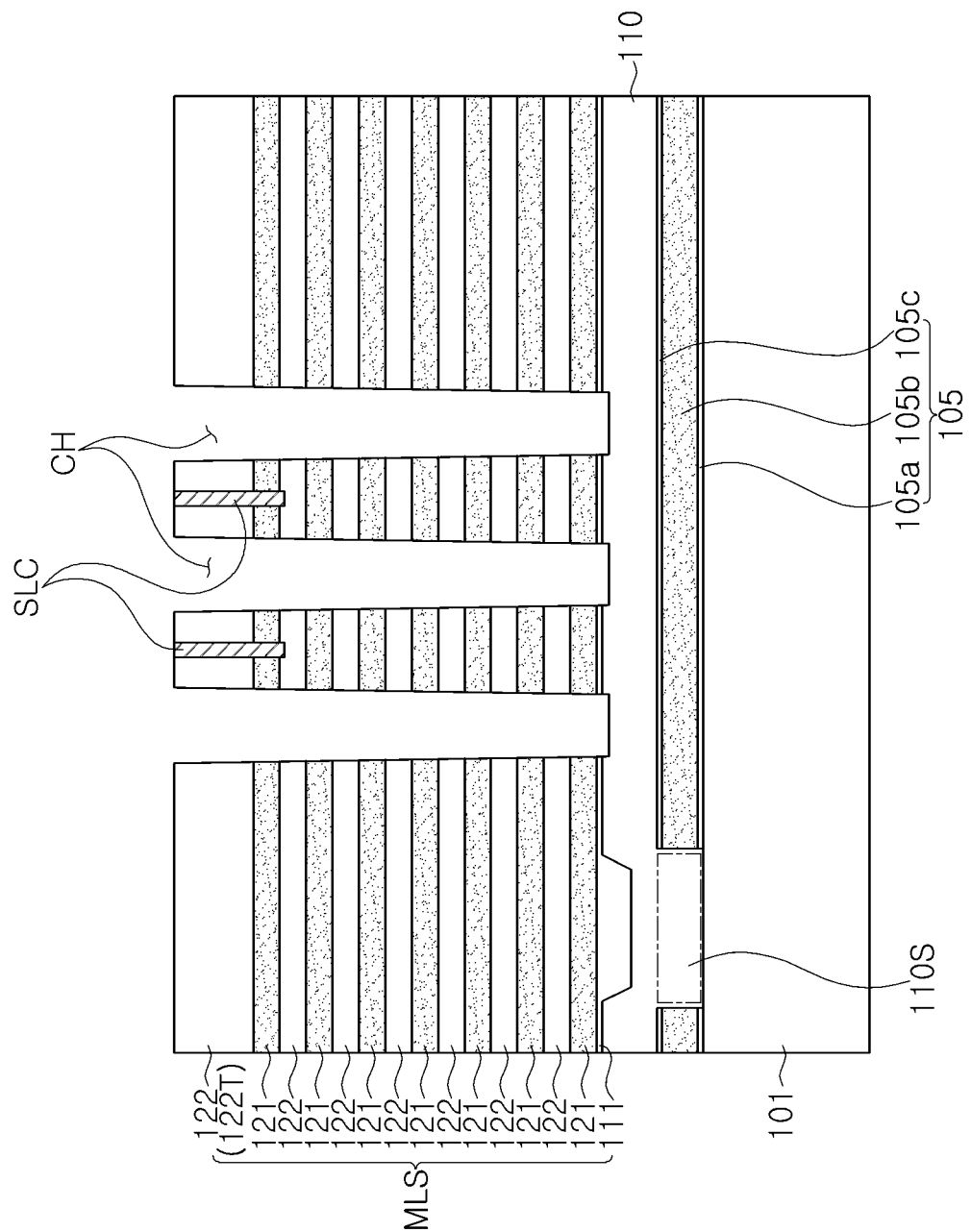
FIGS. 6, 7, 8, 9, 10, 11, 12 and 13 are cross-sectional views illustrating processes of a method of fabricating a 3D semiconductor device according to various exemplary embodiments of the present inventive concept.

Referring to FIG. 6, a lower sacrificial layer 105 and an etch-stop layer 110 (referred to as an "insulating base layer") are formed on a substrate 101, and a mold stack structure (MIS) is formed on the etch-stop layer 110. Subsequently, channel holes CH are formed in the mold structure MLS.

The substrate 101 may be, for example, a silicon substrate, a germanium substrate, or a silicon-germanium substrate. The lower sacrificial layer 105 may be a region defining the conductive layer (180 in FIG. 3). The lower sacrificial layer 105 may include a material having etch selectivity with the etch-stop layer 110. For example, the lower sacrificial layer 105 may include silicon oxide, silicon oxynitride, or silicon nitride. In this embodiment, the lower sacrificial layer 105 may have a three-layer structure similar to the vertical insulating layer (see 171 in FIG. 3), and for example, may include silicon oxide 105a/silicon nitride 105b/silicon oxide 105c.

The etch-stop layer 110 is formed to cover the lower sacrificial layer 105. The etch-stop layer 110 may be a high dielectric layer having etch selectivity with materials of the mold stack structure MLS. The etch-stop layer 110 may include the high dielectric layer illustrated above, and may include, for example, $Al_2O_3$ or $H)_2$. The etch-stop layer 110 may include a support 110S so that a space may be maintained even after the lower sacrificial layer 105 is removed. The support 110S may be a region from which the lower sacrificial layer 105 is removed and may be provided as a region of the etch-stop layer 110 that is in direct contact with the lower structure (for example, the substrate 101).

The mold stack structure MLS may include a lower insulating film 111 disposed on the etch-stop layer 110, and sacrificial layers 121 and mold insulating layers 122 alternately disposed on the lower insulating film 111. For example, the lower insulating film 111 may include a material similar to that of the mold insulating layer 122. The sacrificial layers 121 may include a sacrificial material having etch selectivity with respect to the mold insulating layers 122. For example, the mold insulating layers 122 may include silicon oxide or silicon nitride, and the sacrificial layers 121 may include silicon, silicon oxide, silicon carbide, or silicon nitride.

In this embodiment, the thicknesses of the lower insulating film 111 and the mold insulating layers 122 may not be the same. The lower insulating film 111 may be formed to have a relatively thin thickness. An uppermost insulating layer 122T may be formed to have a relatively great thickness. Exemplary embodiments of the present inventive concept are not limited thereto, and the thickness and/or number of the insulating layers 120 and the sacrificial layers 110 may be variously changed.

Subsequently, the channel holes CH may be formed in the mold structure MLS. The channel holes CH may be formed to penetrate through the sacrificial layers 121, the mold insulating layers 122, and the lower insulating film 111, using an anisotropic etching process. In exemplary embodiments of the present inventive concept, inner sidewalls of the channel holes CH may not be substantially perpendicular to the upper surface of the substrate 101. For example, the width of the channel holes CH may decrease as the channel holes CH get closer to the upper surface of the substrate 101.

In the present etching process, by using the etch-stop layer 110 formed of a high dielectric material, the end position of the channel hole CH may be controlled relatively accurately. In this embodiment, an end (for example, the bottom) of the channel hole CH may be located in the etch-stop layer 110. For example, the end of the channel hole CH may penetrate the lower insulating film 111 just above the etch-stop layer 110 to protrude into the etch-stop layer 110. Before forming the channel hole CH, a selection line cut region SLC for the string select line SSL may be formed between the channel holes CH.

Figure 7:
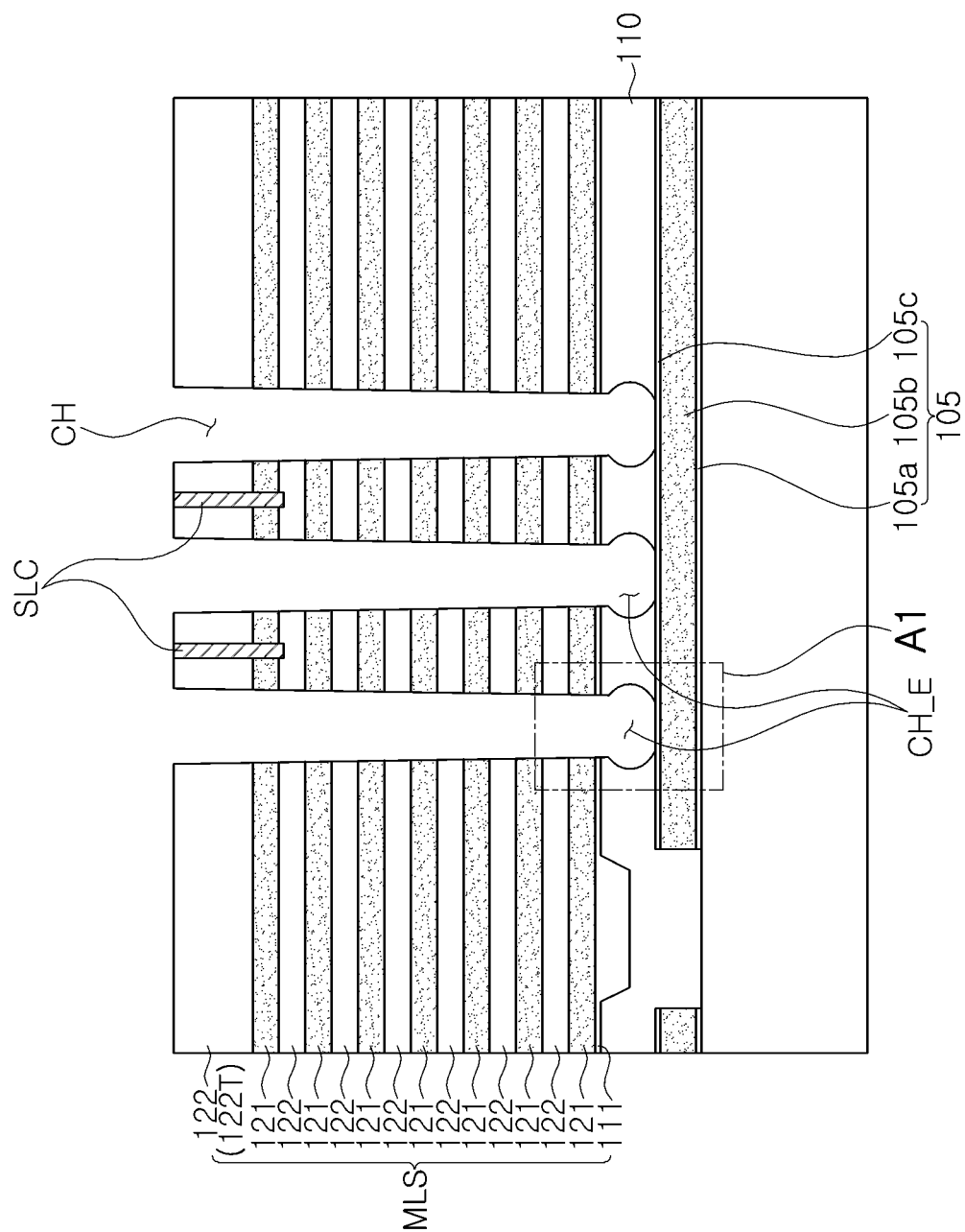

Referring to FIG. 7, a portion of the channel hole CH positioned in the etch-stop layer 110 is extended in the width direction such that the lower sacrificial layer 105 is exposed.

This process may be performed by an isotropic etching process (for example, wet etching) capable of selectively etching the etch-stop layer 110. As illustrated in FIG. 14A, isotropic etching may be performed on the end of the channel hole CH to provide a first expansion space CH_E having a jar shape with a convex side. In this etching process, the lower sacrificial layer 105 may be exposed through a bottom surface of the first expansion space CH_E. An exposed region of the lower sacrificial layer 105 may be used as a passage through which a portion of the vertical insulating layer 171 to be formed in the first expansion space CH_E may be removed in a subsequent process of removing the lower sacrificial layer 105.

Figure 8:
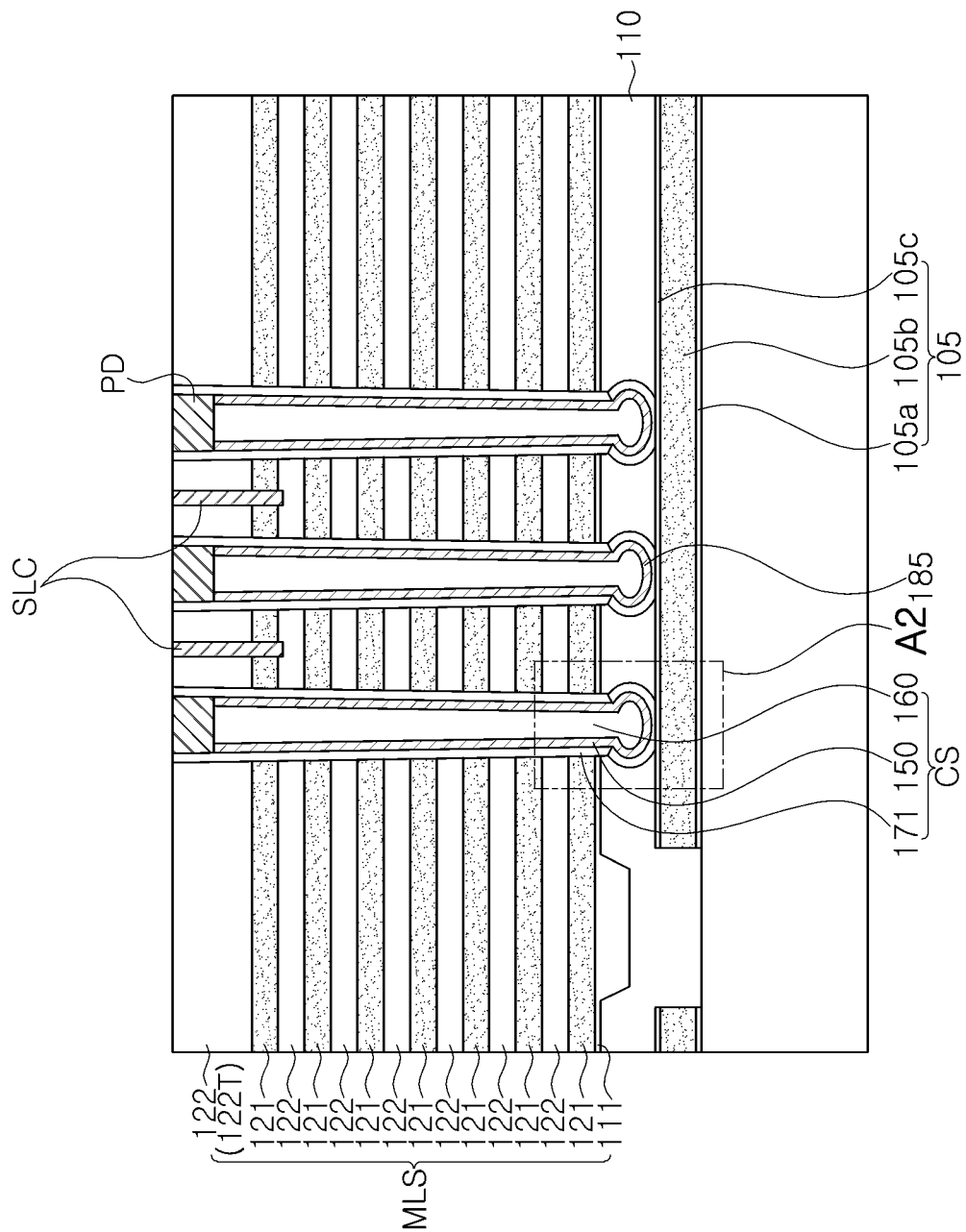

Referring to FIG. 8, a vertical structure CS may be formed in the channel hole CH.

The vertical structure CS may be formed by sequentially forming a vertical insulating layer 171, a vertical channel layer 150, and an insulating core 160 on an inner sidewall of the channel hole CH and a surface exposed by the first expansion space CH_E. As illustrated in FIG. 14B, the vertical insulating layer 171 may be conformally formed on the inner sidewalls of the channel holes CH and the exposed surfaces of the first expansion spaces CH_E. As described above, the vertical insulating layer 171 employed in this embodiment may be formed by sequentially depositing a blocking insulating film 171a, a charge storage film 171b, and a tunneling insulating film 171c. Subsequently, the vertical channel layer 150 may be formed on the surface of the vertical insulating layer 171. The vertical insulating layer 171 and/or the vertical channel layer 150 may be formed using atomic layer deposition (ALD) or chemical vapor deposition (CVD).

The insulating core 160 may be filled in an internal space of the vertical channel layer 150. For example, the insulating core 160 may include silicon oxide, silicon nitride, or silicon oxynitride, and in for example, may be formed of spin on glass (SOG) oxide. As described above, the vertical insulating layer 171, the vertical channel layer 150, and the insulating core 160 are sequentially formed to form the vertical structure CS, and as illustrated in FIG. 14B, the vertical structure CS may have a first extended area EA having a convex jar shape in the first expansion space CH_E.

Next, portions of upper ends of the vertical channel layer 150 and the insulating core 160 are recessed using an etch back process to form a pad PD using a conductive material. After forming a conductive material layer filling the recessed region to form the pad PD, a planarization process may be performed to expose an uppermost mold insulating layer 122T. The pad PD is connected to the vertical channel layer 150 and may provide a contact region for connection with a bit line or the like in a subsequent process.

Figure 9:
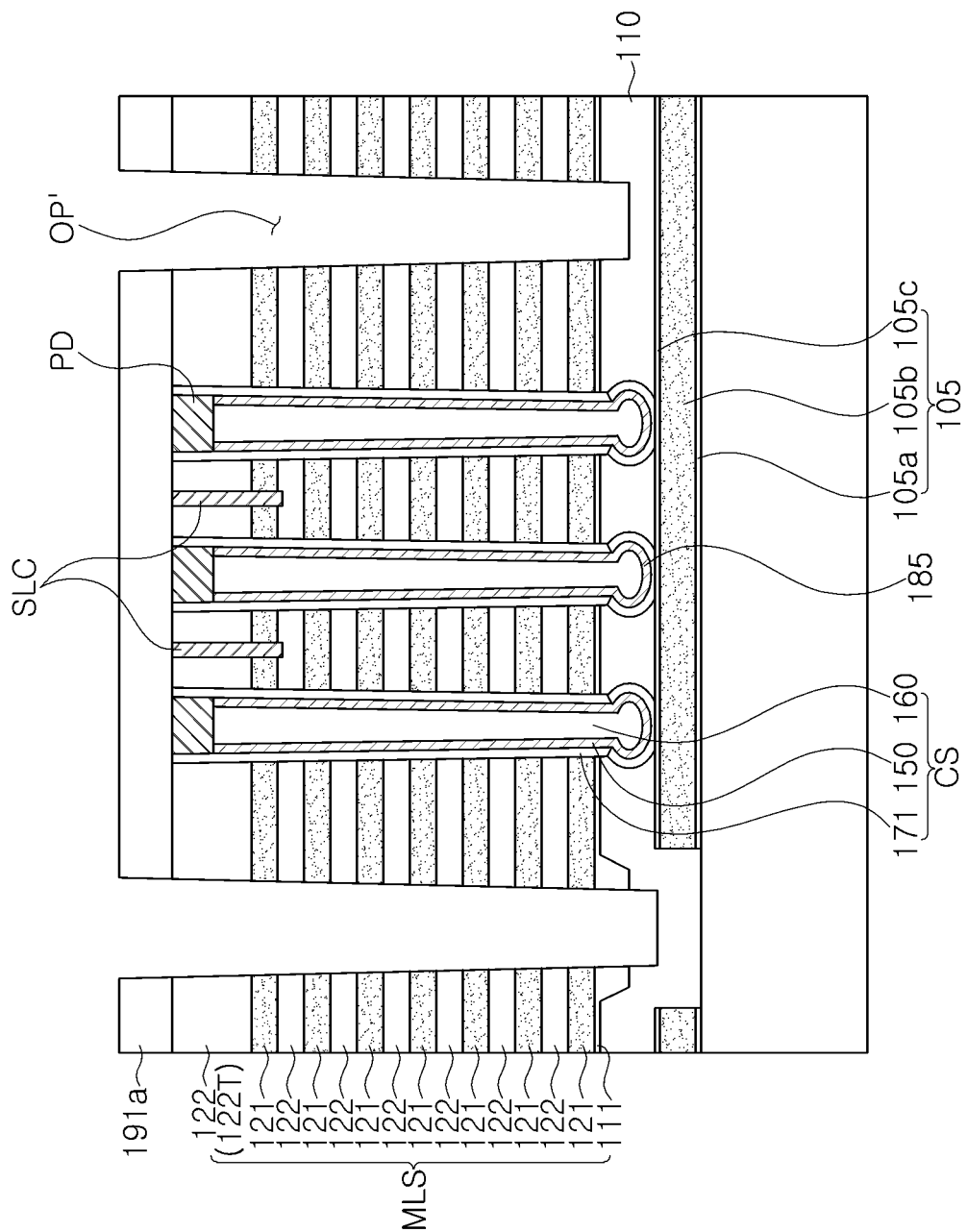

Referring to FIG. 9, an opening OP' is formed to penetrate through the mold stack structure MLS and the etch-stop layer 110, to be connected to the lower sacrificial layer 105.

Before forming the opening OP', a first interlayer insulating film 191a (also referred to as a "protective insulating film") may be formed to cover the pad PD in the mold stack structure MLS. The protective insulating film 191a may protect an uppermost insulating layer 1221', the pad PD, and the vertical structure CS in a subsequent etching process. The opening OP' may be formed by forming a mask using a photolithography process and performing anisotropic etching by using the mask. The opening OP' may be a trench extending in a direction (for example, the Y direction). The opening OP' may expose a portion of the etch-stop layer 110. In other words, a portion of the etch-stop layer 110 may be exposed through the opening OP'.

Similarly to the foregoing process of forming the channel hole CH (see FIG. 6), also in this etching process, the end position of the opening OP' may be controlled relatively accurately, using the etch-stop layer 110 formed of a high dielectric material.

Figure 10:
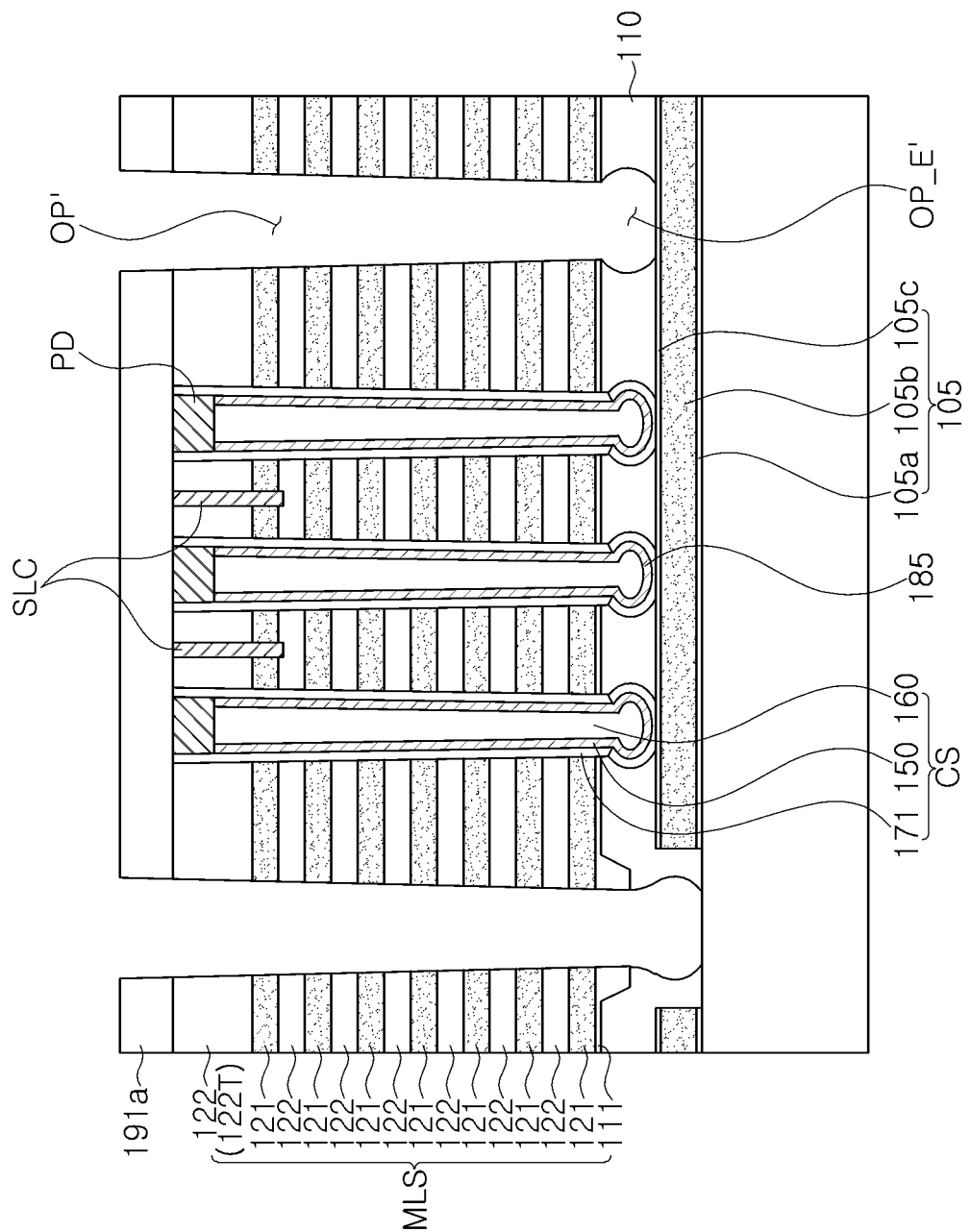

Referring to FIG. 10, a second expansion space OP_E' may be formed by extending the opening OP' located in the etch-stop layer 110 to expose the lower sacrificial layer 105.

This process may be performed by an isotropic etching process (for example, wet etching) capable of selectively etching the etch-stop layer 110 similarly to the above-described expansion process (see FIG. 7). Isotropic etching may be performed on the end of the opening OP to form the second expansion space OP_E' having a jar shape with a convex side. In this etching process, the lower sacrificial layer 105 may be exposed through the bottom surface of the second expansion space OP_E'.

Figure 11:
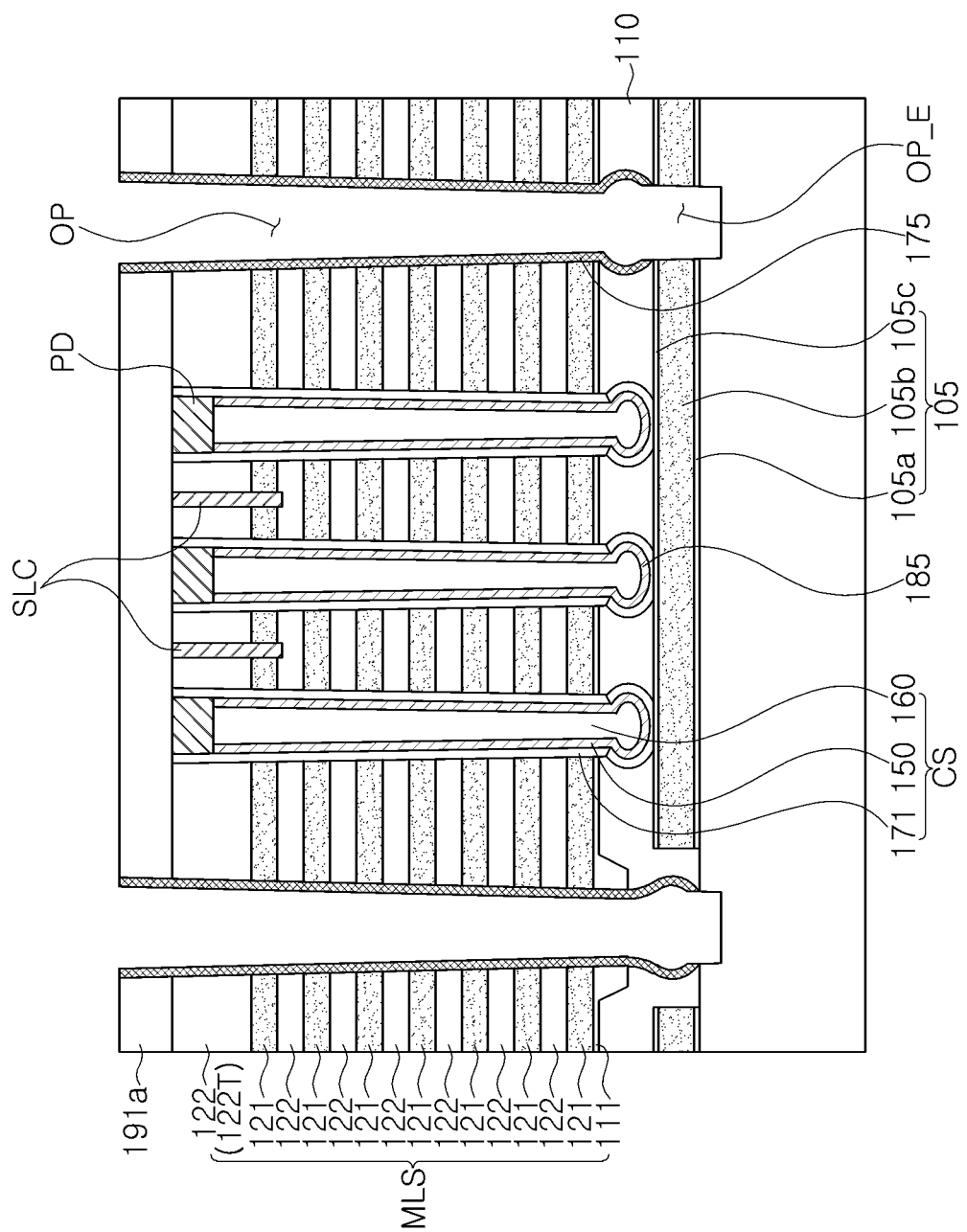

Referring to FIG. 11, an insulating spacer 175 is formed on an inner sidewall of the opening OP, and the opening OP is extended to a portion of the substrate 101, using the insulating spacer 175.

After forming the insulating spacer 175 on the inner surface of the opening OP, an anisotropic etching process may be performed to open the bottom surface of the opening OP to expose the lower sacrificial layer 105 to the bottom surface of the opening OP. The opening OP may be extended to a portion of the substrate 101, using the insulating spacer 175 obtained thereby. As a result, since the lower sacrificial layer 105 may be exposed to the lower end of the opening OP, the lower sacrificial layer 105 may be removed through the opening OP.

Figure 12:
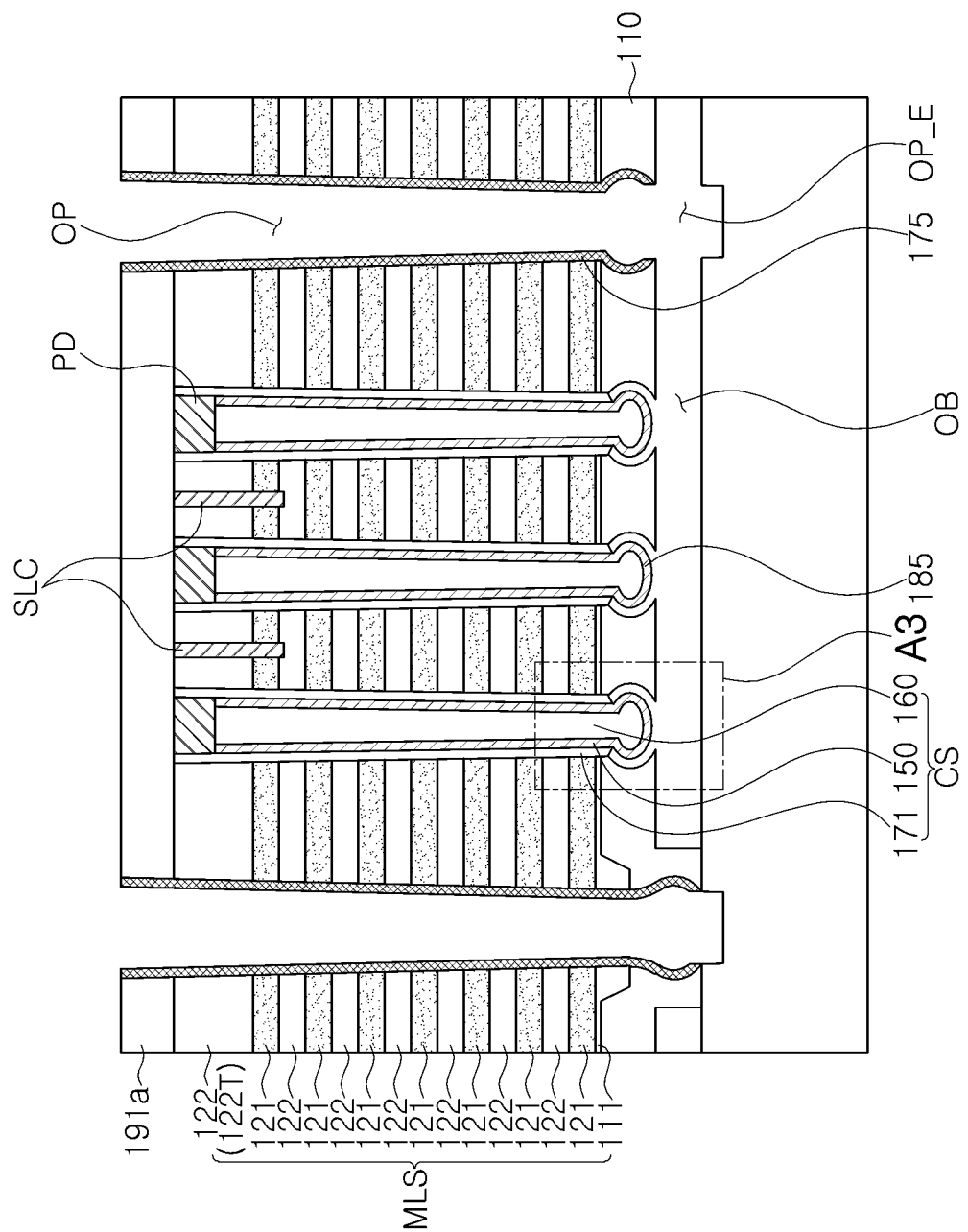

Referring to FIG. 12, at least a portion of the vertical insulating layer 171 disposed in the etch-stop layer 110 may be removed together with the lower sacrificial layer 105 through the opening OP.

In the process of removing the lower sacrificial layer 105 through the opening OP, the mold stack structure MLS may not be damaged by the insulating spacer 175. The lower sacrificial layer 105 is removed to form a space OB for a common source line (or the conductive layer 180), and as illustrated in FIG. 14C, the vertical insulating layer 171 positioned in the first extended area EA is partially removed, thereby providing an empty space OB_E in the first extended area EA while being connected with the lower sacrificial layer 105 in an additional etching process. The empty space OB_E may be a region where the conductive film ("185" of FIG. 13) is formed in a subsequent process.

As the additional etching process is performed, the vertical insulating layer 171 may be gradually removed upwardly from the bottom surface of the first extended area EA. As described above, an area in which the vertical insulating layer 171 is etched may be positioned below the lower insulating film 111. This etching path may proceed through the convex side of the extended area EA. Since the etching progresses later when the etchant passes through the convex side of the extended area EA, the etching may be effectively prevented from being etched to the lower insulating film 111 due to rapid overetching.

Figure 13:
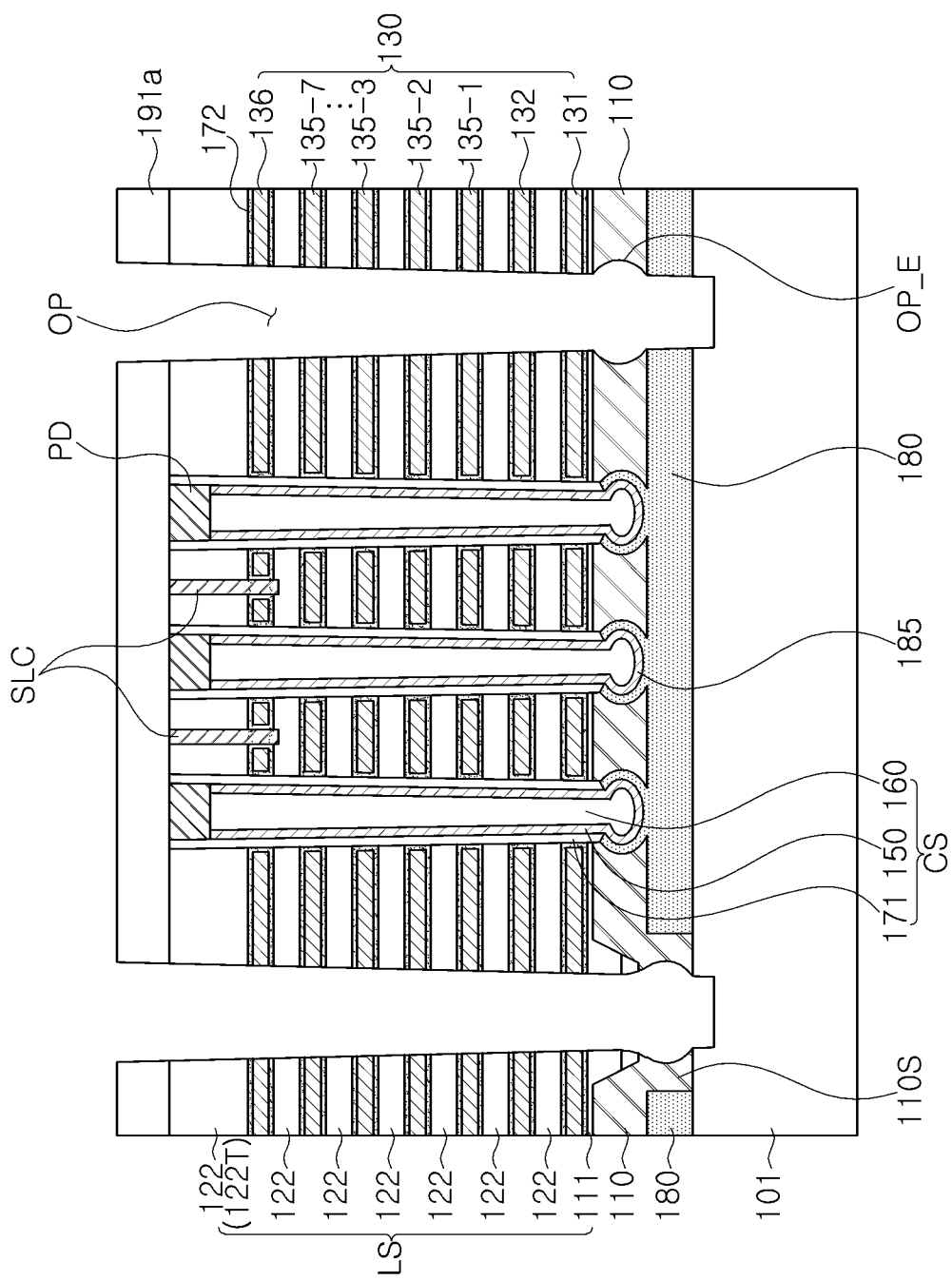
Figure 14A:
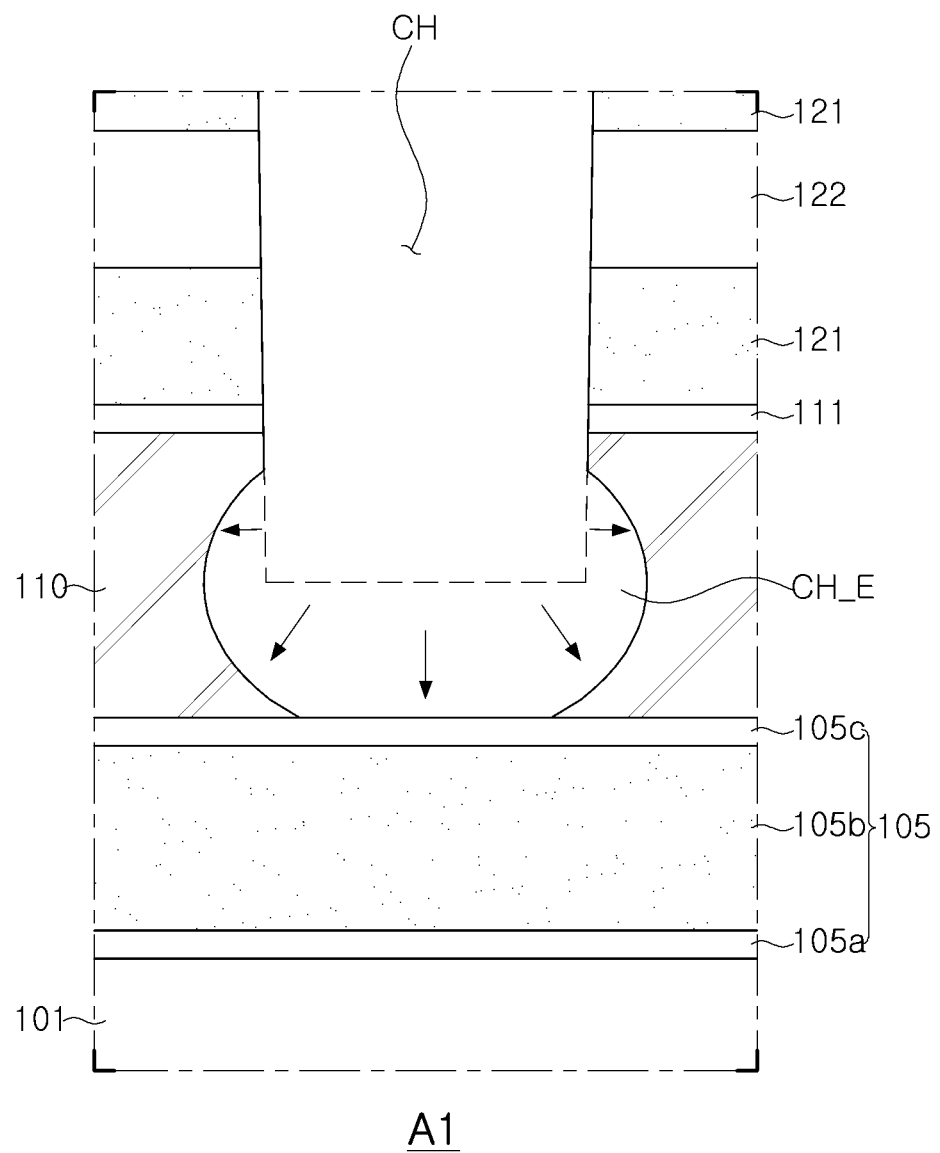
FIGS. 14A, 14B and 14C are partially enlarged views of FIGS. 7, 8 and 11, respectively.
Figure 14B:
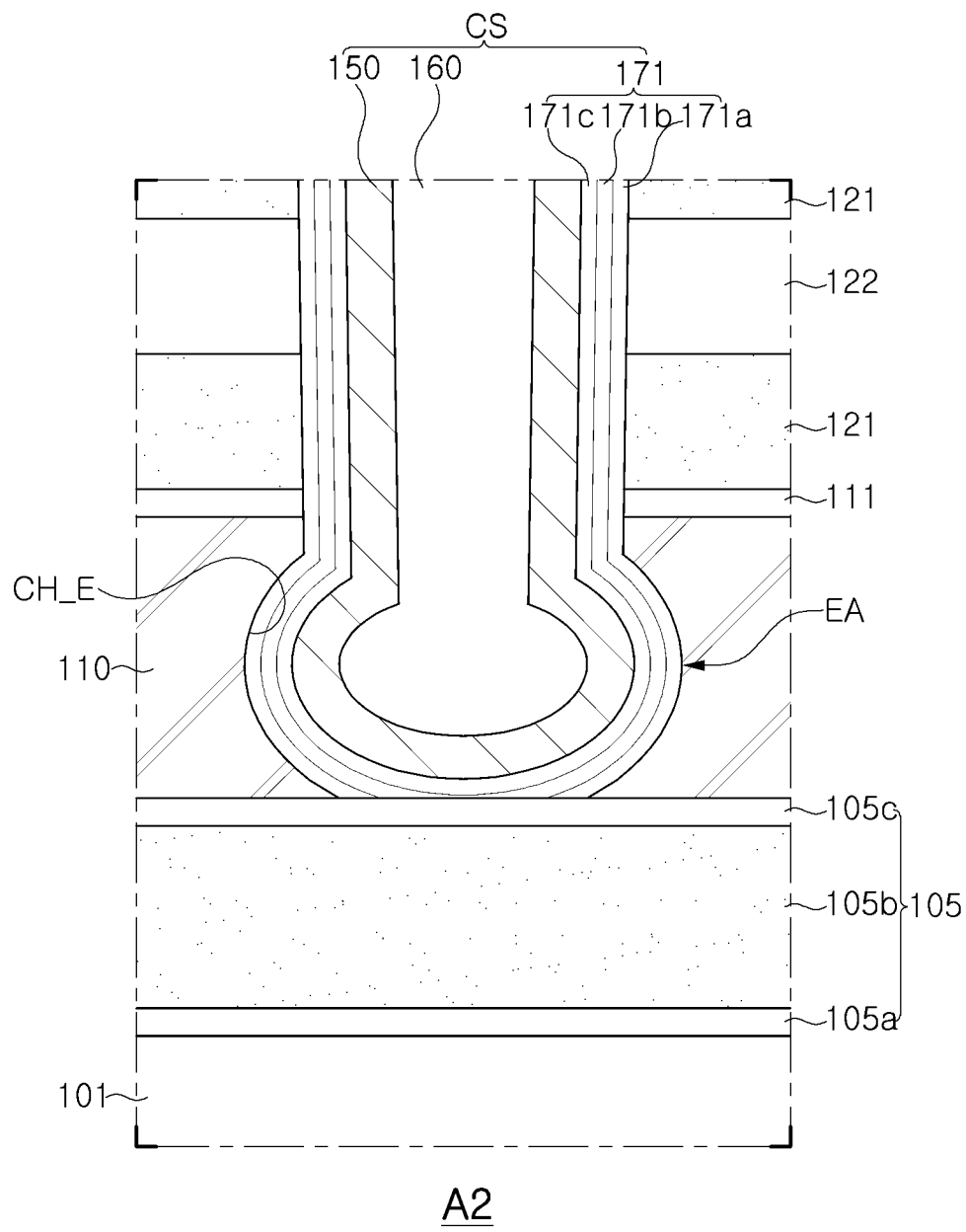
Figure 14C:
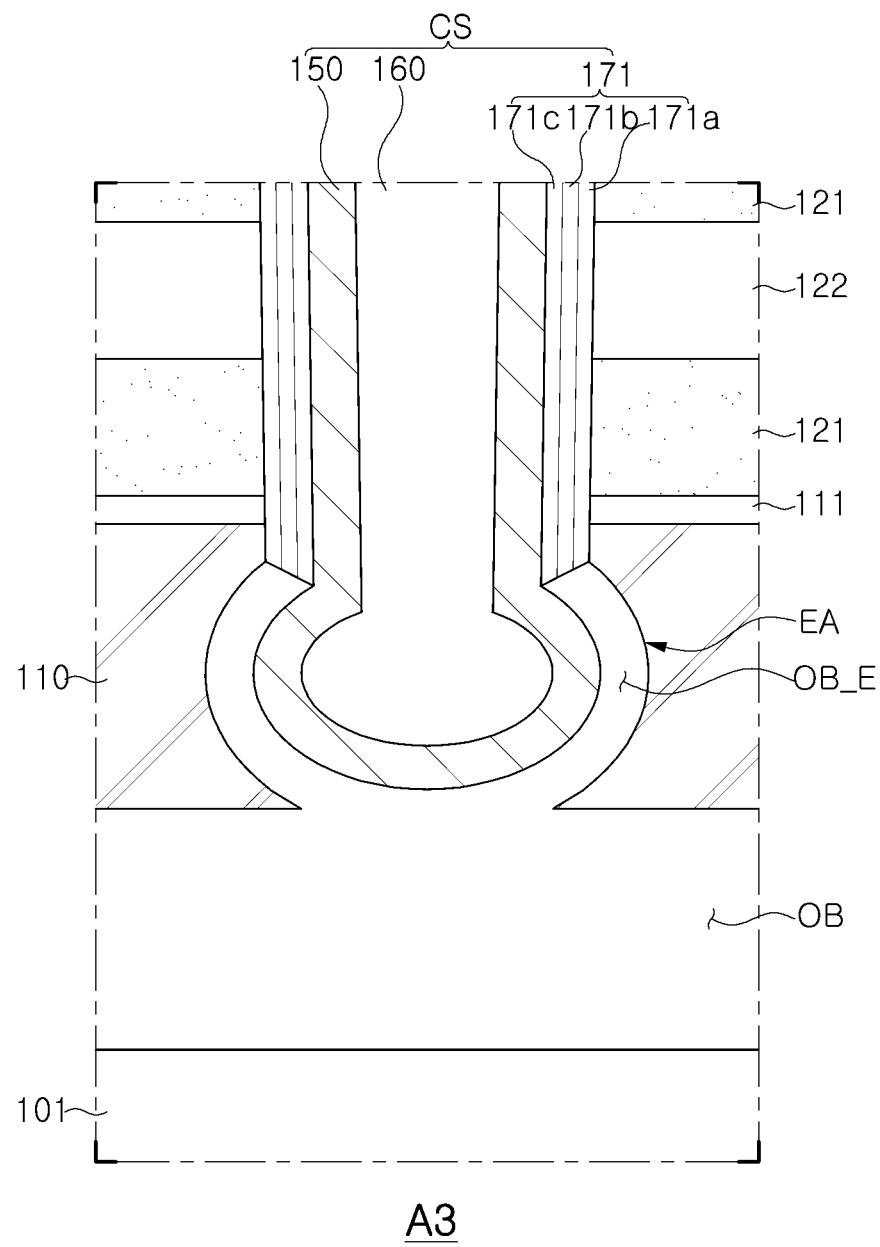

Referring to FIG. 13, the conductive layer 180 may be formed by filling a conductive material doped with a first conductivity-type impurity IP in the spaces OB and OB_E obtained in the foregoing process.

The conductive layer 180 may be formed by depositing a conductive material doped with the first conductivity-type impurity in the space OB in which the lower sacrificial layer 105 has been removed. In the process of forming the conductive layer 180, the conductive film 185 connected to the conductive layer 180 may be formed in the space OB_E in which the vertical insulating layer 171 has been removed.

The conductive film 185 may include the same conductive material as the conductive layer 180 as an element extending from the conductive layer 180. The conductive film 185 may be formed of a conductive material doped with a high concentration of a first conductivity-type impurity (IP) in the same as or similar manner as the conductive layer 180. For example, the conductive layer 180 and the conductive film 185 may include polysilicon doped with n-type impurities. As described above, the impurity IP may be diffused into the vertical channel layer 150 adjacent thereto through the conductive film 185. To effectively induce such impurity diffusion, an additional heat treatment process may be performed.

Next, the insulating spacer 175 is removed in the opening OP the sacrificial layers 121 exposed through the opening OP are removed, and as illustrated in FIG. 13, planar insulating layers 172 and gate electrodes 130 may be formed. Subsequently, as illustrated in FIG. 3, an isolation structure IS may be formed by filling the opening OP with an insulating material, and a process for an upper wiring, including the bit line BL, may be performed.

In the foregoing embodiments, the end of the vertical structure CS is illustrated as being located in the insulating base layer 110 (for example, the etch-stop layer), but the end of the channel hole CH may also be located below the etch-stop layer depending on the etching process of forming the channel hole CH. In this case, the conductive film 185 is also provided in the extended area EA having the convex side located in the insulating base layer 110, and the impurity may be diffused in the channel region of the GIDL transistor through the conductive film 185.

Figure 15:
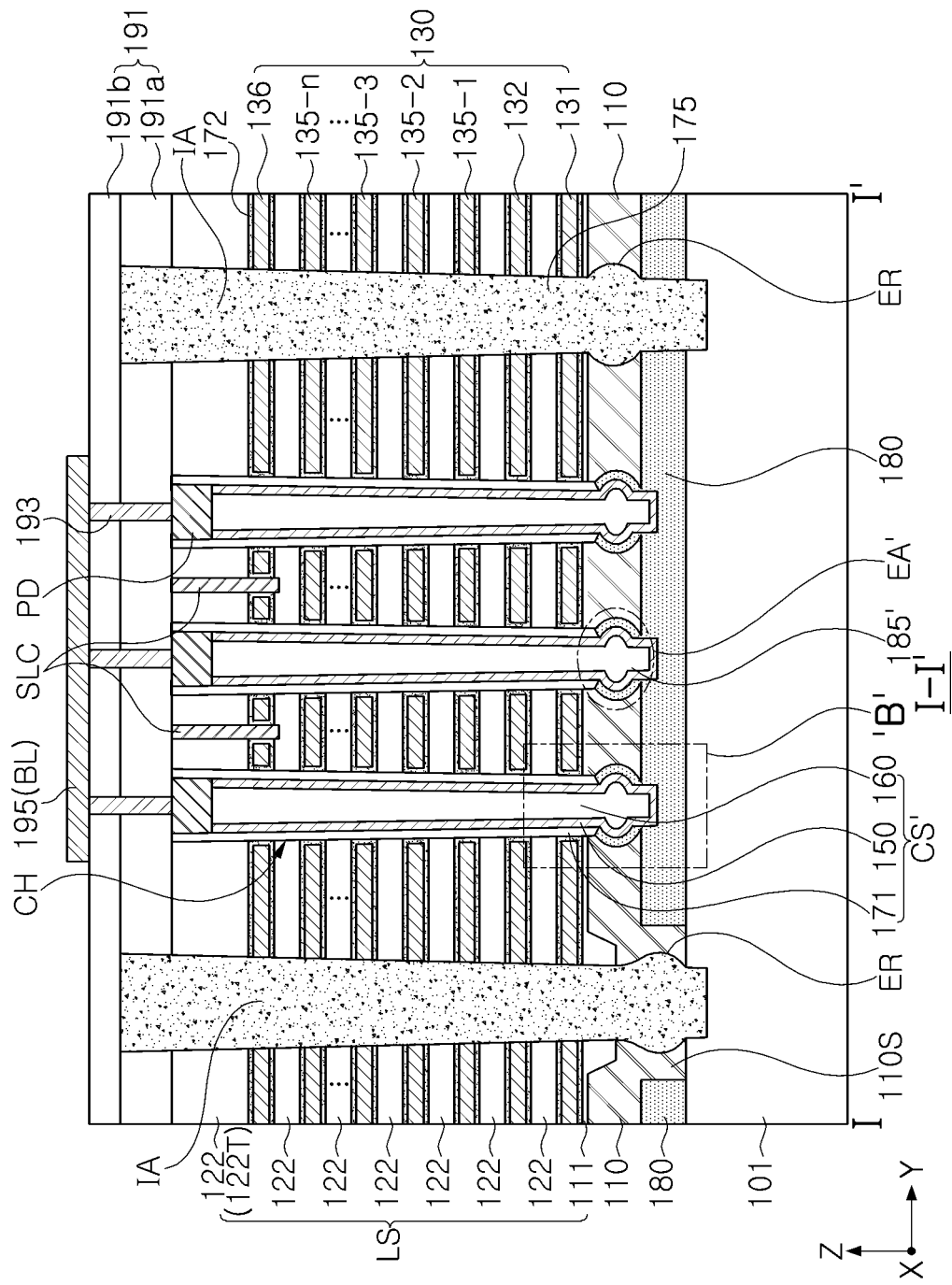
FIG. 15 is a schematic plan view illustrating a three-dimensional semiconductor device according to an exemplary embodiment of the present inventive concept.
Figure 16:
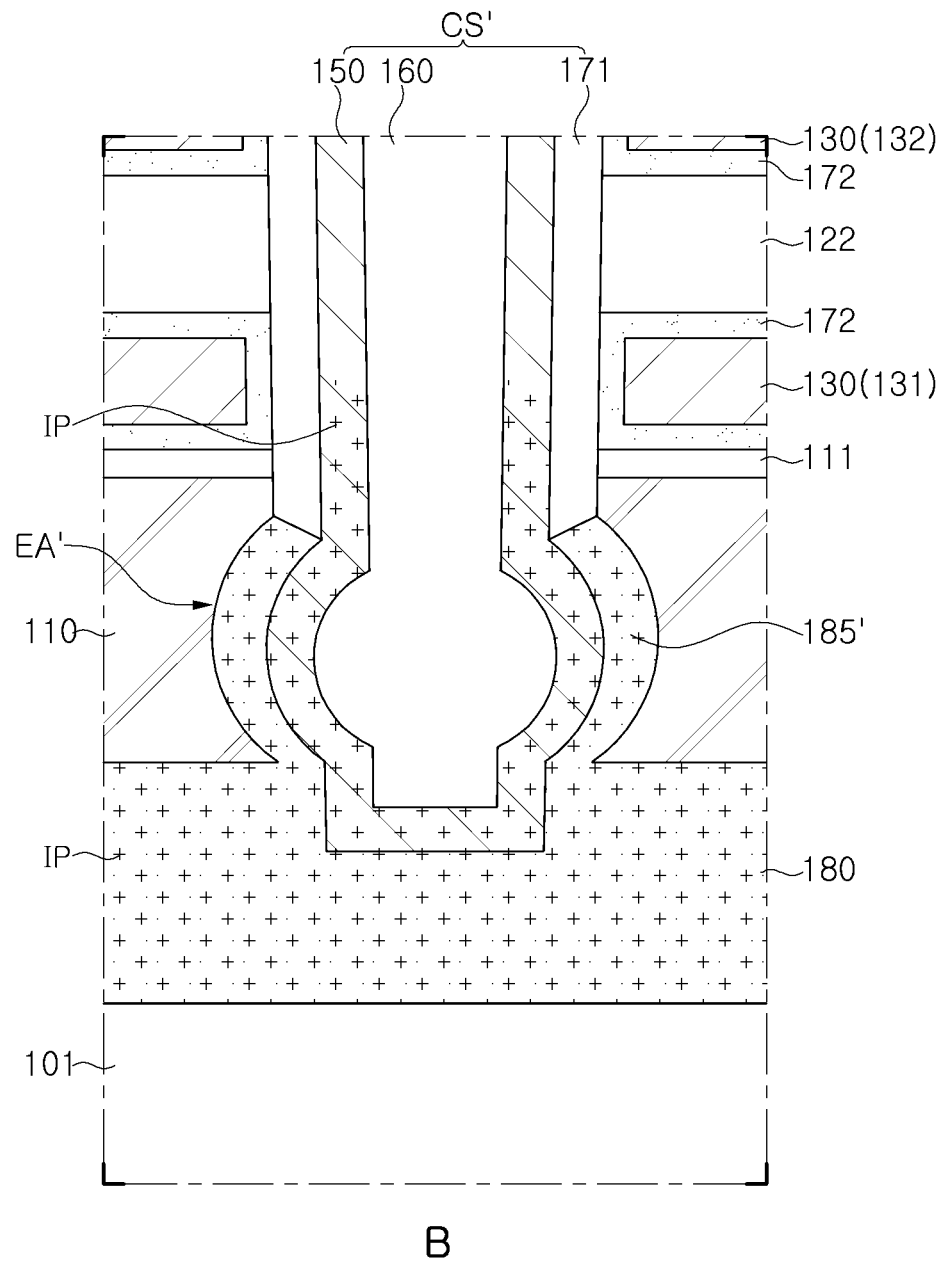
FIG. 16 is an enlarged cross-sectional view illustrating region "B" in the 3D semiconductor device illustrated in FIG. 15.

FIG. 15 is a schematic plan view illustrating a three-dimensional semiconductor device according to an exemplary embodiment of the present inventive concept, and FIG. 16 is an enlarged cross-sectional view illustrating a region "B" in the three-dimensional semiconductor device illustrated in FIG. 15.

Referring to the semiconductor device of FIGS. 15 and 16, except that a bottom surface of a vertical structure CS' is located on a lower level than a bottom surface of the insulating base layer 110, the semiconductor device may be similar to the semiconductor device 100 illustrated in FIGS. 1 to 3. In addition, the components of this embodiment may be the same as or similar to the components of the semiconductor device 100 illustrated in FIGS. 1 to 3, unless otherwise stated.

Similar to the foregoing embodiment, the vertical structure CS' employed in this embodiment may include a first extended area EA' in the insulating base layer 110, and may include a conductive film 185' extending along the surface of the vertical channel layer 150. In this case, an end or a bottom surface of the vertical structure CS' may be located below the bottom surface of the insulating base layer 110. In other words, the bottom surface of the insulating base layer 110 may be penetrated in the channel hole forming process (see FIG. 6). In this case, the first extended area EA' may only be formed in the insulating base layer 110 having a relatively high etching selectivity, but the end of the channel hole CH may be positioned in the lower sacrificial layer 105 (in the conductive layer 180 in the final structure). Therefore, the vertical channel layer 150 may extend to the inside of the lower sacrificial layer 105 (the conductive layer 180 in the final structure). In exemplary embodiments of the present inventive concept, the insulating core 160 may also be located in the lower sacrificial layer 105 (the conductive layer 180 in the final structure) below a lower surface of the insulating base layer 110.

Also in this embodiment, in the process of forming the conductive layer 180, a portion of the vertical insulating layer 171 in the first extended area EA is partially removed and is filled with the same material as the removed conductive layer 180, thereby forming the conductive film 185'. Since the conductive film 185' is formed of a conductive material doped with impurities similarly to the conductive layer 180, the impurities may be diffused to the vertical channel layer 150 adjacent thereto.

Figure 17:
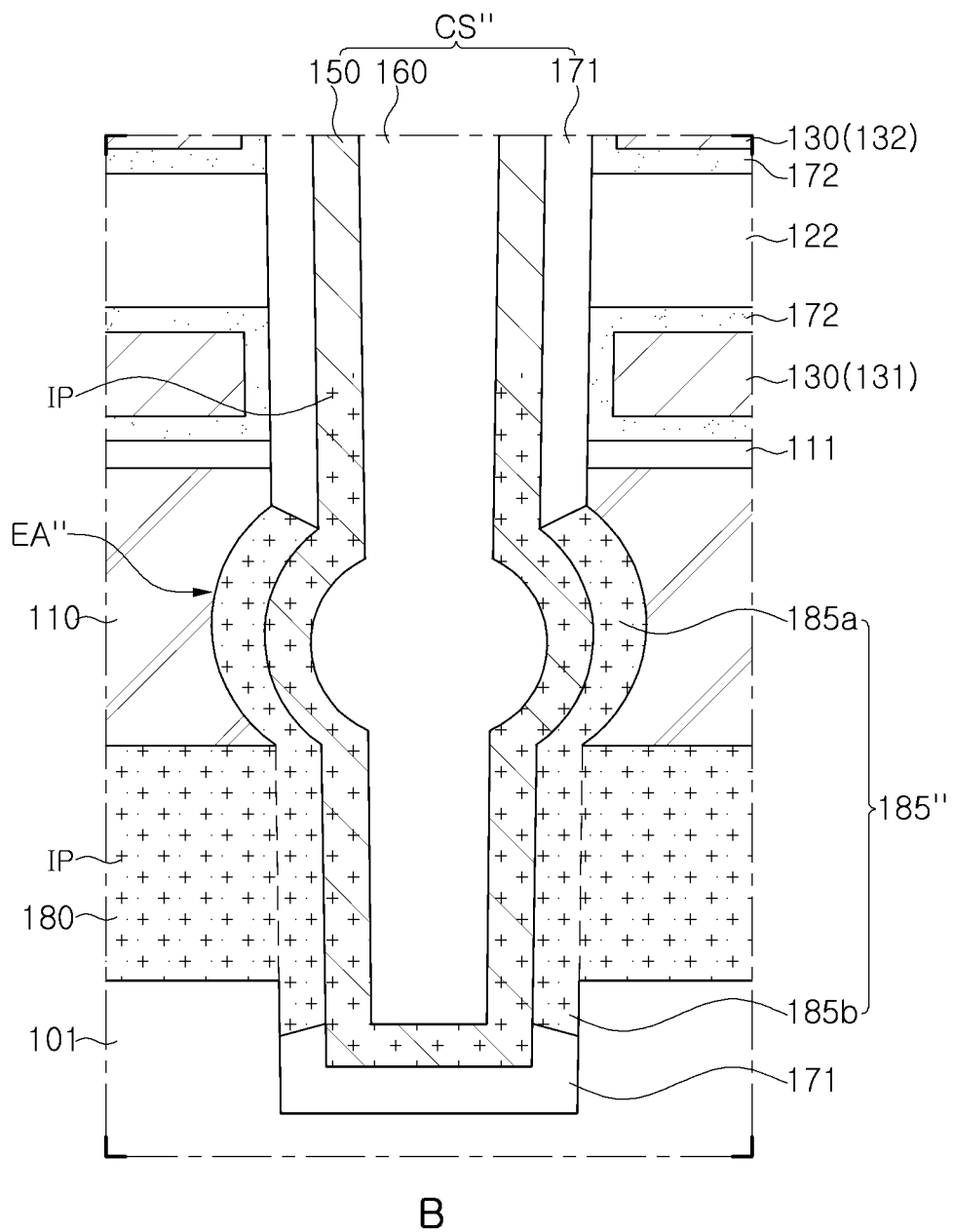
FIG. 17 is a partially enlarged view of region of a three-dimensional semiconductor device according to an exemplary embodiment of the present inventive concept, corresponding to region "B" of FIG. 15.

FIG. 17 is a schematic plan view illustrating a three-dimensional semiconductor device according to an exemplary embodiment of the present inventive concept.

Referring to FIG. 17, a semiconductor device according to the present embodiment may be similar to the semiconductor device illustrated in FIGS. 1 to 3, 15 and 16, except that a vertical structure CS″ extends to a portion of a substrate 101. The components of this embodiment may be the same as or similar to the components of the semiconductor devices illustrated in FIGS. 1 to 3, 15 and 16, unless specifically stated otherwise.

Similar to the foregoing embodiment, the vertical structure CS″ employed in this embodiment may include a first extended area EA″ in an insulating base layer 110, and may include a conductive film (185a and 185b) extending along the surface of a vertical channel layer 150 of the first extended area EA″. In this case, the vertical structure CS may penetrate through the conductive layer 180, and the bottom surface thereof may be located in the substrate 101. This also may be understood as a case in which the lower sacrificial layer 105 is penetrated in the process of forming the channel hole (see FIG. 6) similar to the previous embodiment. Since the end of the channel hole CH is located in a portion of the substrate 101, the vertical insulating layer 171 and the vertical channel layer 150 may extend to the region of the substrate 101 positioned below the conductive layer 180. In exemplary embodiments of the present inventive concept, the ends of the insulating core 160 may also be located in the region of the substrate 191.

Also in this embodiment, in the process of forming the conductive layer 180, not only the vertical insulating layer 171 in the first extended area EA″ is partially removed, but also the vertical insulating layer 171 positioned in the substrate 101 may be partially removed. However, a portion of the vertical insulting layer 171 may remain in the substrate 101. An upper conductive film 185a and a lower conductive film 185b may be provided by filling the removed regions with the same material as the conductive layer 180. In this case, the upper conductive layer 185a may contribute to the diffusion of impurities into the vertical channel layer 150 adjacent thereto, similarly to the conductive films 185 and 185' of the previous embodiments.

As set forth above, according to an exemplary embodiment of the present inventive concept, since a GIDL transistor is formed on top of a stack structure without using an ion implantation process that can cause a failure, a semiconductor device having excellent reliability and a method of fabricating the same may be provided.

While the present inventive concept has been illustrated and described with reference to exemplary embodiments thereof it will be apparent to those skilled in the art that modifications and variations could be made thereto without departing from the scope of the present inventive concept as set forth by the appended claims.

What is claimed is:

1. A three-dimensional semiconductor device, comprising:
   a conductive layer disposed on a substrate and including a first conductivity-type impurity;
   an insulating base layer disposed on the conductive layer;
   a stack structure including a lower insulating film disposed on the insulating base layer, and a plurality of gate electrodes and a plurality of mold insulating layers alternately stacked on the lower insulating film, wherein the insulating base layer includes a high dielectric material;
   a vertical structure including a vertical channel layer penetrating through the stack structure and a vertical insulating layer disposed between the vertical channel layer and the plurality of gate electrodes, the vertical structure having an extended area extending in a width direction in the insulating base layer; and
   an isolation structure penetrating through the stack structure, the insulating base layer and the conductive layer, and extending in a direction parallel to an upper surface of the substrate,
   wherein the conductive layer has a first extension portion extending from a bottom surface of the vertical channel layer along a side surface of the vertical channel layer in the extended area of the vertical structure,
   wherein the vertical structure further corn irises an insulating core disposed in a direction perpendicular to the upper surface of the substrate in the vertical channel layer, and the insulating core has a second extension portion extending in the width direction in the insulating base layer.

2. The three-dimensional semiconductor device of claim 1, wherein a portion of the vertical channel layer adjacent to the first extension portion has a higher concentration of the first conductivity-type impurity than a portion of the vertical channel layer adjacent to the plurality of gate electrodes.

3. The three-dimensional semiconductor device of claim 1, wherein a portion of the vertical channel layer adjacent to a lowermost gate electrode of the plurality of gate electrodes has a higher concentration of the first conductivity-type impurity than a portion of the vertical channel layer adjacent to an uppermost gate electrode of the plurality of gate electrodes.

4. The three-dimensional semiconductor device of claim 1, wherein the conductive layer comprises polysilicon having an n-type impurity.

5. The three-dimensional semiconductor device of claim 1, wherein the extended area has a convex side.

6. The three-dimensional semiconductor device of claim 1, wherein the first extension portion extends to an upper half of the extended area.

7. The three-dimensional semiconductor device of claim 1, wherein an upper end of the first extension portion is located below the lower insulating film.

8. The three-dimensional semiconductor device of claim 1, wherein an upper end of the first extension portion is connected to a lower end of the vertical insulating layer.

9. The three-dimensional semiconductor device of claim 1, wherein the insulating base layer has a support region in contact with the substrate.

10. The three-dimensional semiconductor device of claim 1, wherein deviations of a maximum width of the extended area and a thickness of the insulating base layer are within a range of ±30.

11. The three-dimensional semiconductor device of claim 10, wherein the thickness of the insulating base layer is 30 nm to 50 nm, and the maximum width of the extended area is 30 nm to 60 nm.

12. The three-dimensional semiconductor device of claim 1, wherein the insulating base layer comprises aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$) hafnium aluminum oxide ($HfAl_xO_y$), or praseodymium oxide ($Pr_2O_3$).

13. The three-dimensional semiconductor device of claim 1, wherein the isolation structure is in contact with the substrate.

14. A three-dimensional semiconductor device, comprising:
a conductive layer disposed on a substrate;
an insulating base layer disposed on the conductive layer and having a plurality of support regions in contact with the substrate;
a stack structure having a plurality of gate electrodes and a plurality of mold insulating layers alternately disposed on the insulating base layer;
a vertical structure including a vertical channel layer penetrating through the stack structure, and a vertical insulating layer disposed between the vertical channel layer and the plurality of gate electrodes, the vertical structure having a first extended area extending in a width direction in the insulating base layer and having a convex side; and
an isolation structure penetrating through the stack structure, the insulating base layer and the conductive layer, extending in a first direction parallel to an upper surface of the substrate, and having a second extended area extending in a second direction intersecting the first direction and parallel to the upper surface of the substrate in the insulating base layer,
wherein the conductive layer has a first extension portion extending along a surface of the vertical channel layer, and an upper end of the first extension portion is connected to a lower end of the vertical insulating layer on the surface of the vertical channel layer in the first extended area of the vertical structure,
wherein the vertical structure further comprises an insulating core disposed in a direction perpendicular to the upper surface of the substrate in the vertical channel layer, and the insulating core has a second extension portion extending in the width direction in the insulating base layer.

15. The three-dimensional semiconductor device of claim 14, wherein the insulating base layer comprises a high dielectric material.

16. The three-dimensional semiconductor device of claim 14, wherein the conductive layer and the vertical channel layer include polysilicon.

17. The three-dimensional semiconductor device of claim 14, wherein a lower end of the vertical channel layer is located below a lower surface of the insulating base layer.

18. The three-dimensional semiconductor device of claim 14, wherein a lower end of the vertical channel layer is located below the upper surface of the substrate.

19. A three-dimensional semiconductor device, comprising:
a conductive layer disposed on a substrate and including a first conductivity type impurity;
an insulating layer disposed on the conductive layer;
a stack structure including a lower insulating film disposed on the insulating layer, and a plurality of gate electrodes and a plurality of mold insulating layers alternately stacked on the lower insulating film, wherein the insulating layer includes a high dielectric material;
a vertical structure including a vertical channel layer penetrating through the stack structure and a vertical insulating layer disposed between the vertical channel layer and the plurality of gate electrodes, the vertical structure having a first area in the insulating layer, wherein a side of the first area in the insulating layer overlaps a lowermost gate electrode of the gate electrodes in a direction perpendicular to an upper surface of the substrate; and
a conductive film extending from the conductive layer and covering at least a bottom surface of the vertical channel layer in the first area, wherein the conductive film includes the first conductivity-type impurity,
wherein the vertical structure further comprises an insulating core disposed in a direction perpendicular to the upper surface of the substrate in the vertical channel layer, and the insolating core has an extended portion extending in the width direction in the insulating base layer.

* * * * *